United States Patent
Fry, Jr. et al.

(10) Patent No.: US 10,263,351 B2
(45) Date of Patent: Apr. 16, 2019

(54) ORTHOGONAL ELECTRICAL CONNECTOR SYSTEM

(71) Applicant: FCI USA LLC, Etters, PA (US)

(72) Inventors: Rupert Fry, Jr., Mechanicsburg, PA (US); Charles Copper, Hummelstown, PA (US)

(73) Assignee: FCI USA LLC, Etters, PA (US)

( * ) Notice: Subject to any disclaimer, the term of this patent is extended or adjusted under 35 U.S.C. 154(b) by 19 days.

(21) Appl. No.: 14/794,313

(22) Filed: Jul. 8, 2015

(65) Prior Publication Data
US 2016/0013570 A1    Jan. 14, 2016

Related U.S. Application Data

(60) Provisional application No. 62/023,476, filed on Jul. 11, 2014.

(51) Int. Cl.
| | |
|---|---|
| *H01R 12/70* | (2011.01) |
| *H01R 43/20* | (2006.01) |
| *H01R 12/72* | (2011.01) |
| *H01R 12/73* | (2011.01) |
| *H01R 24/84* | (2011.01) |
| *H05K 3/36* | (2006.01) |

(52) U.S. Cl.
CPC ........ *H01R 12/7076* (2013.01); *H01R 12/724* (2013.01); *H01R 12/737* (2013.01); *H01R 24/84* (2013.01); *H01R 43/205* (2013.01); *H05K 3/366* (2013.01); *H05K 2201/044* (2013.01); *H05K 2201/10189* (2013.01)

(58) Field of Classification Search
CPC ......... H01R 12/52; H01R 23/27; H01R 9/096
USPC .......................................... 439/660, 65, 284
See application file for complete search history.

(56) References Cited

U.S. PATENT DOCUMENTS

| | | | |
|---|---|---|---|
| 4,703,394 A | * | 10/1987 | Petit ..................... H05K 7/1445 361/790 |
| 4,708,660 A | | 11/1987 | Claeys et al. |
| 5,098,311 A | | 3/1992 | Roath et al. |
| 5,199,881 A | | 4/1993 | Oshita et al. |

(Continued)

FOREIGN PATENT DOCUMENTS

| | | |
|---|---|---|
| CN | 102394409 A | 3/2011 |
| CN | 102082339 A | 6/2011 |

(Continued)

OTHER PUBLICATIONS

CN 201580048680.7, dated Aug. 22, 2018, Office Action.

(Continued)

*Primary Examiner* — Tulsidas C Patel
*Assistant Examiner* — Marcus Harcum
(74) *Attorney, Agent, or Firm* — Wolf, Greenfield & Sacks, P.C.

(57) ABSTRACT

In accordance with one embodiment, an electrical connector system can include an electrical signal connector and an electrical power connector. The electrical signal connector and the electrical power connector can be mounted on opposed surfaces of a printed circuit board. The electrical power connector can be constructed as a hermaphroditic power connector that includes at least one header power contact supported by a connector housing, and at least one receptacle power contact supported by the connector housing.

17 Claims, 12 Drawing Sheets

(56) References Cited

U.S. PATENT DOCUMENTS

| | | | |
|---|---|---|---|
| 5,498,167 A | 3/1996 | Seto et al. | |
| 5,904,581 A * | 5/1999 | Pope | H01R 12/716 439/74 |
| 5,971,785 A | 10/1999 | Comerci | |
| 6,045,371 A | 4/2000 | Kagawa et al. | |
| 6,073,229 A * | 6/2000 | Crane, Jr. | G06F 1/186 361/788 |
| 6,102,747 A | 8/2000 | Paagman | |
| 6,147,871 A * | 11/2000 | DeWitt | G06F 13/409 361/752 |
| 6,402,566 B1 * | 6/2002 | Middlehurst | H01R 13/113 439/680 |
| 7,182,608 B2 | 2/2007 | Soh et al. | |
| 7,435,095 B1 | 10/2008 | Yi | |
| 7,445,457 B1 * | 11/2008 | Frangioso, Jr. | H05K 1/115 361/805 |
| 7,581,972 B2 * | 9/2009 | Daamen | H01R 13/6315 439/249 |
| 7,976,316 B2 | 7/2011 | Ohshida | |
| 7,976,317 B2 * | 7/2011 | Patel | H01R 12/7088 439/699.1 |
| 8,043,097 B2 | 10/2011 | Ngo et al. | |
| 8,062,046 B2 * | 11/2011 | Daily | H01R 13/113 439/290 |
| 8,079,847 B2 * | 12/2011 | Davis | H01R 23/688 439/607.11 |
| 8,591,250 B2 * | 11/2013 | Chin | H01R 12/724 439/485 |
| 2007/0010108 A1 * | 1/2007 | Yeen Soh | H01R 12/716 439/74 |
| 2007/0184676 A1 * | 8/2007 | Minich | H01R 12/714 439/65 |
| 2007/0232089 A1 * | 10/2007 | Fung | H05K 1/14 439/65 |
| 2008/0045079 A1 * | 2/2008 | Minich | H01R 12/727 439/544 |
| 2010/0167569 A1 * | 7/2010 | Stoner | H01R 13/193 439/284 |
| 2011/0207342 A1 * | 8/2011 | Davis | H01R 12/724 439/65 |
| 2013/0273781 A1 * | 10/2013 | Buck | H01R 13/516 439/626 |
| 2014/0017940 A1 * | 1/2014 | Chen | H01R 13/6477 439/607.02 |

FOREIGN PATENT DOCUMENTS

| | | |
|---|---|---|
| CN | 102969624 A | 3/2013 |
| EP | 0494759 | 7/1992 |
| EP | 0924806 | 6/1999 |
| JP | 2001307846 | 11/2001 |
| JP | 2003317831 | 11/2003 |
| TW | 104122629 | 12/2018 |
| WO | WO 00/016445 | 3/2000 |
| WO | WO 2014/159908 | 10/2014 |

OTHER PUBLICATIONS

Chinese Office Action for Chinese Application No. 201580048680.7 dated Aug. 22, 2018.

Taiwanese Office Action for Taiwanese Application No. 104122629 dated Dec. 22, 2018.

* cited by examiner

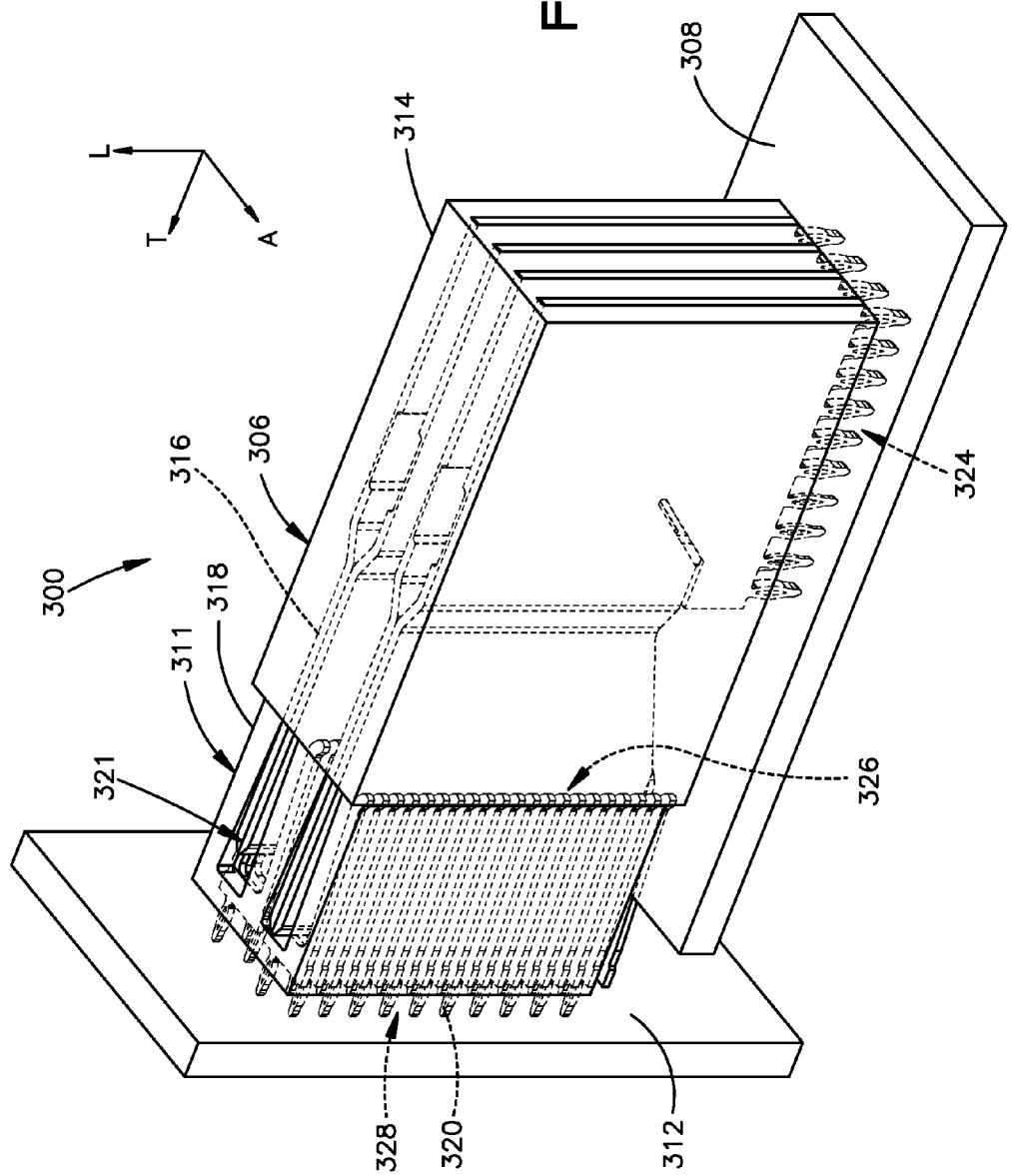

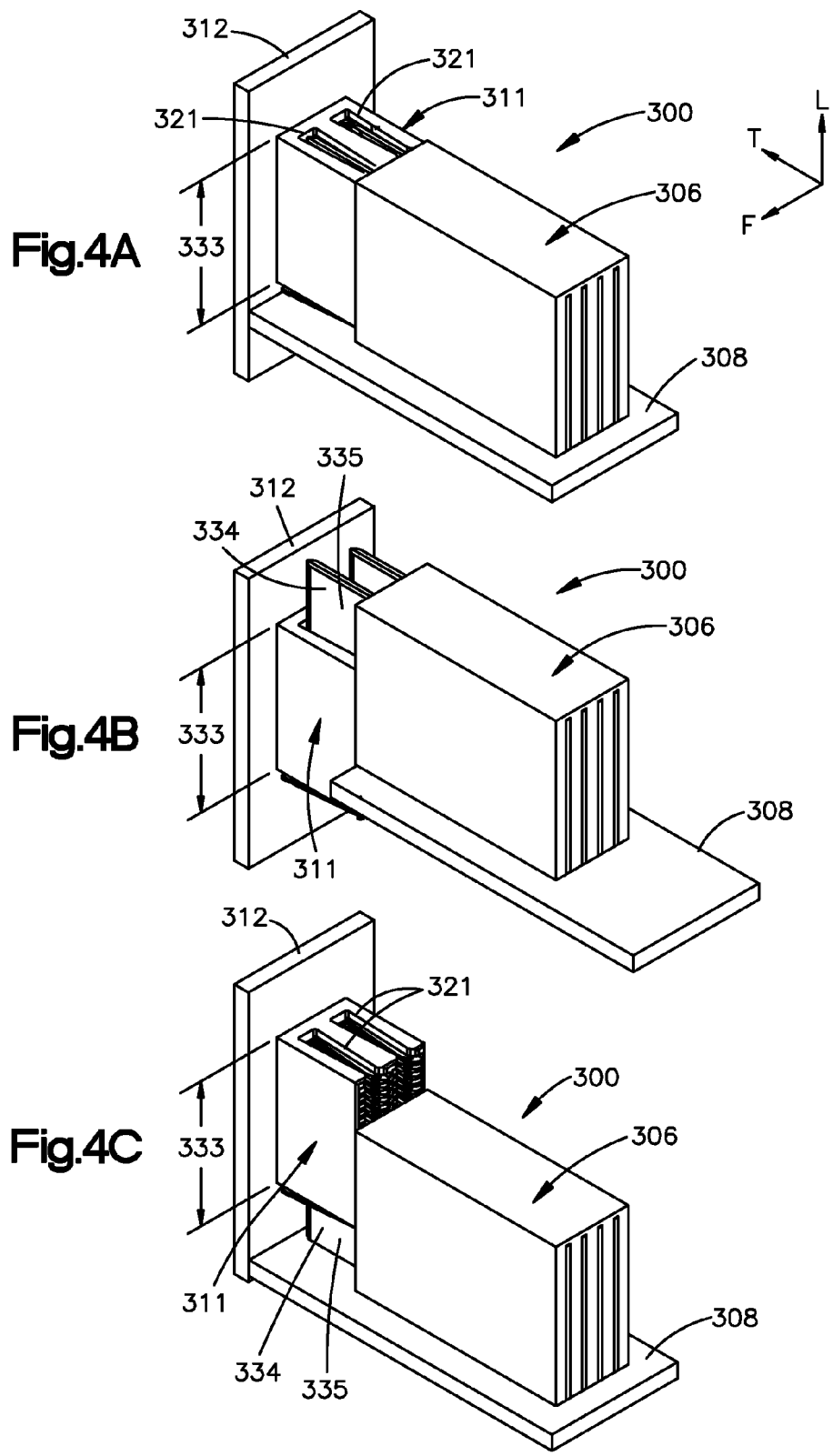

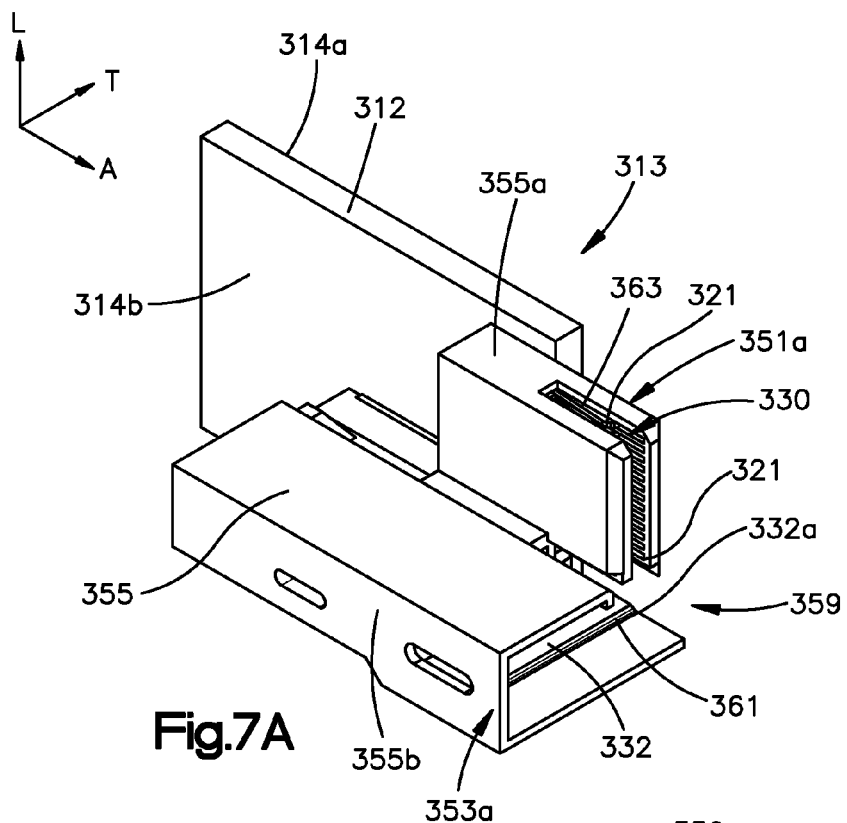
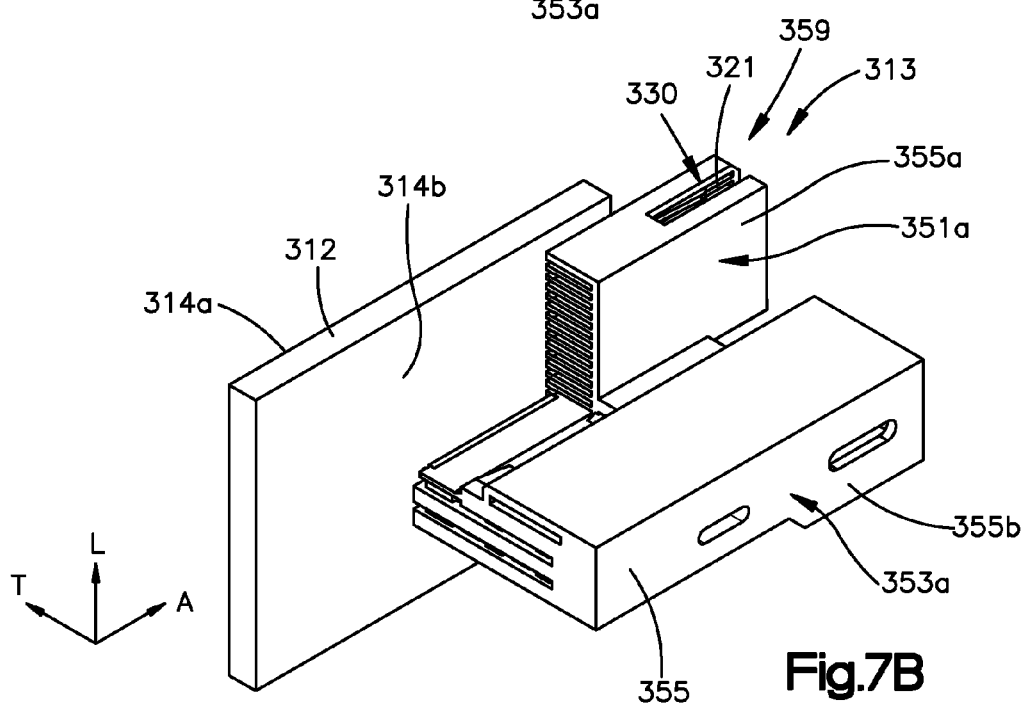

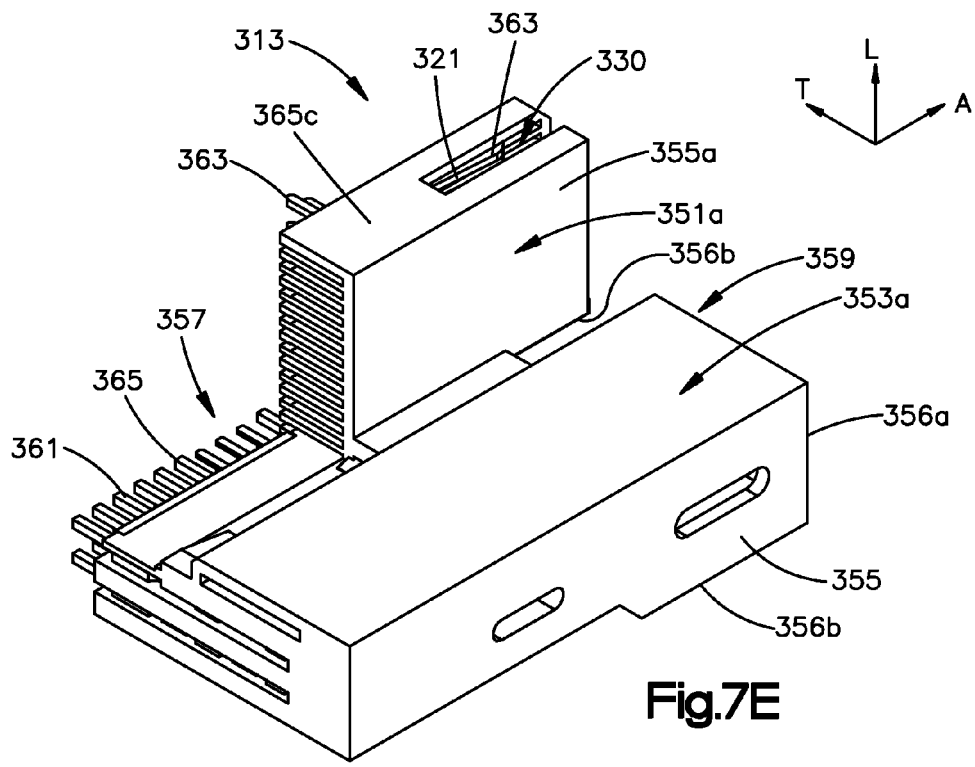
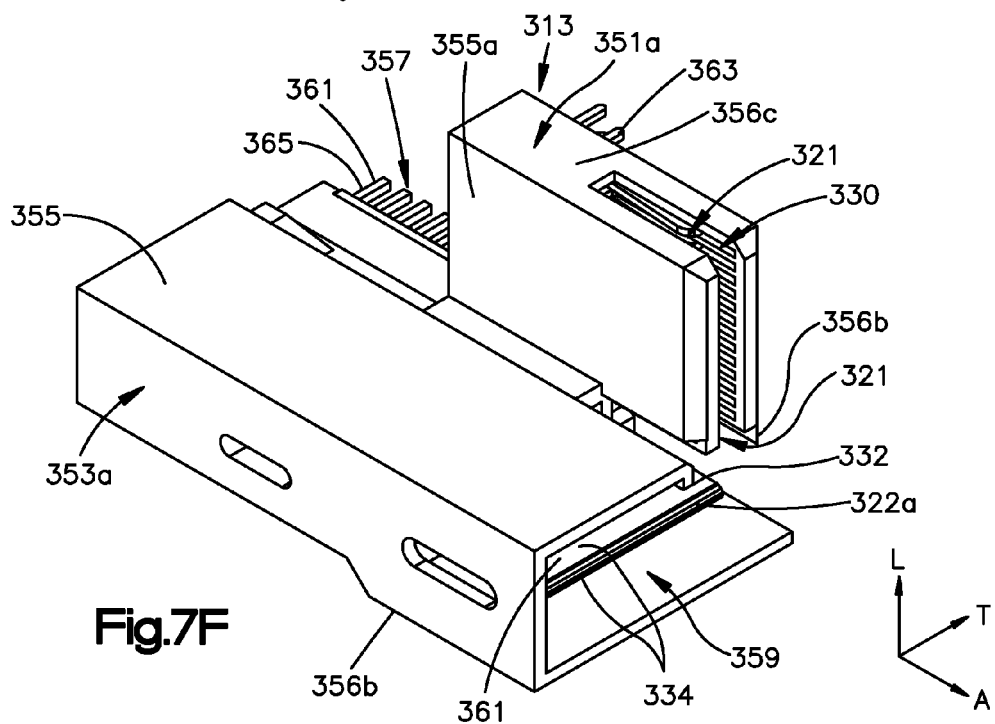

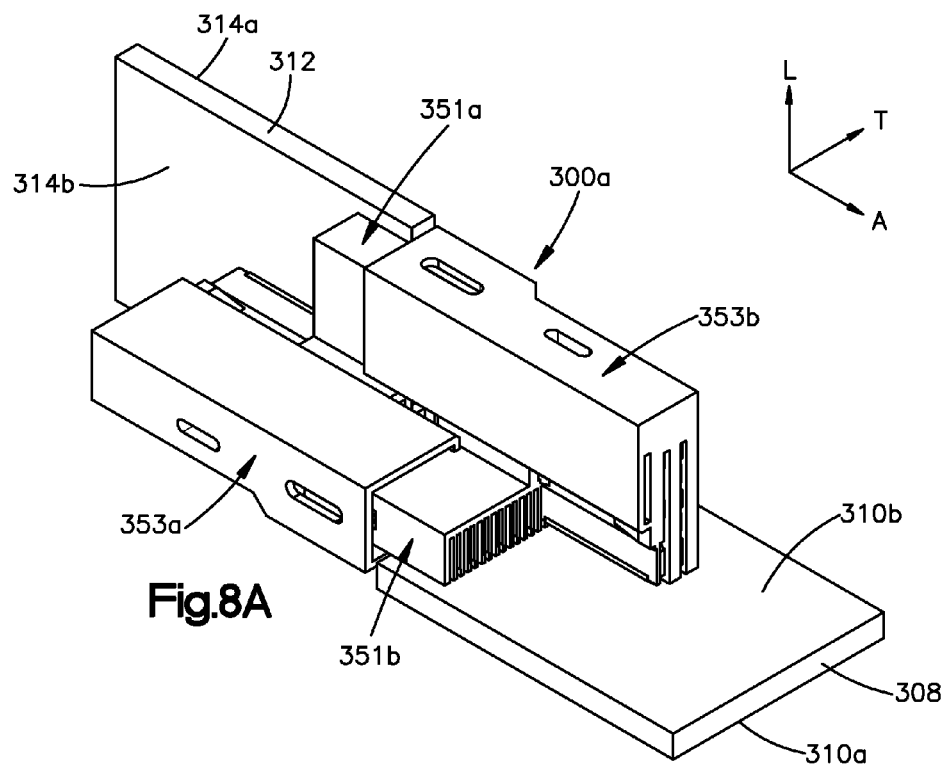
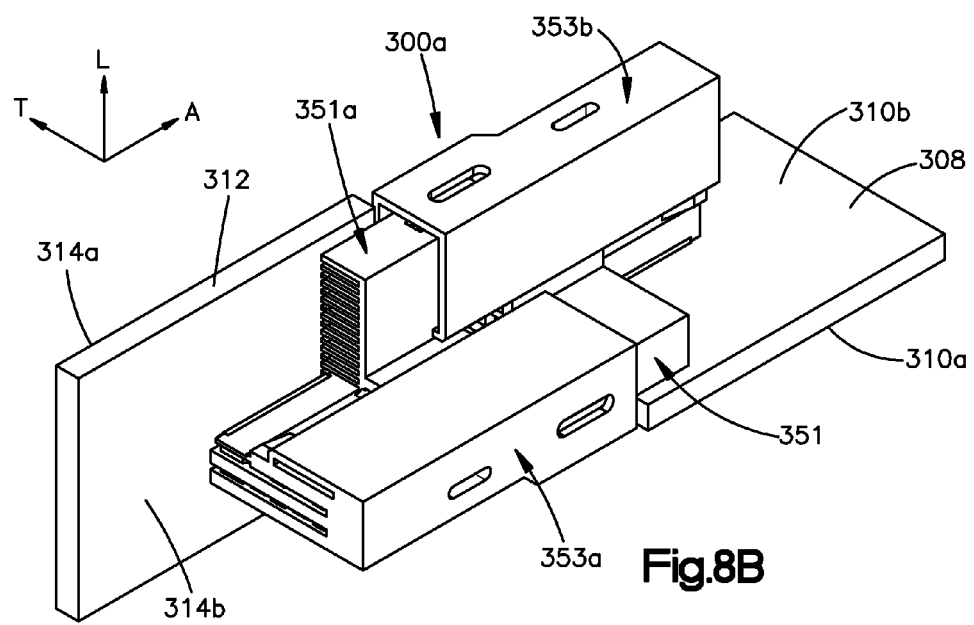

ORTHOGONAL ELECTRICAL CONNECTOR SYSTEM

CROSS REFERENCE TO RELATED APPLICATIONS

This Application claims the benefit of U.S. Provisional 62/023,476 filed Jul. 11, 2014, the disclosure of which is hereby incorporated by reference as if set forth in its entirety herein.

BACKGROUND

An orthogonal electrical connector system is described in U.S. Pat. No. 8,079,847, the disclosure of which is hereby incorporated by reference as if set forth in its entirety herein. Orthogonal connector systems can be arranged such that power connectors are directly adjacent signal connectors. Such arrangements can limit air flow, which can limit heat dissipation capabilities.

SUMMARY

In accordance with one embodiment, an electrical connector system can include an electrical signal connector and an electrical power connector. The electrical signal connector can include a first electrically insulative connector housing and a plurality of signal contacts supported by the first connector housing. The first connector housing can define a first mounting interface and a first mating interface configured to mate with a complementary mating interface of a complementary electrical signal connector. The power connector can include a second electrically insulative connector housing and at least one electrical power contact supported by the second connector housing. The second connector housing can define a second mounting interface and a second mating interface configured to mate with a complementary mating interface of a complementary power connector. The electrical connector system can include a first printed circuit board defining a first surface and a second surface opposite the first surface along a first direction, wherein the first mounting interface is mounted to the first surface of the circuit board and the second mounting interface is mounted to the second surface of the printed circuit board.

BRIEF DESCRIPTION OF THE DRAWINGS

FIG. 3A is a perspective view of an electrical power connector assembly and printed circuit boards that can be implemented in the electrical connector system shown in FIG. 1;

FIGS. 4A-C shows the electrical power connector assembly including first and second power connectors mated with each other in different positions, which may be based on varying thicknesses of the printed circuit boards or relative positions of the connectors;

FIG. 7A is a perspective view of one of the hermaphroditic power connectors shown in FIG. 6, shown mounted to a printed circuit board;

FIG. 7B is another perspective view of the hermaphroditic power connector mounted to the printed circuit board;

FIGS. 7E-F are perspective views of the hermaphroditic power connector from FIGS. 7A-B, shown without the printed circuit board FIG. 8A is a perspective view of a portion of the electrical connector system shown in FIG. 1B, showing one hermaphroditic power connector assembly that includes a first and a second hermaphroditic power connectors mated with each other;

FIG. 8B is another perspective view of the hermaphroditic power connector assembly shown in FIG. 8A;

DETAILED DESCRIPTION

Figure 1A:
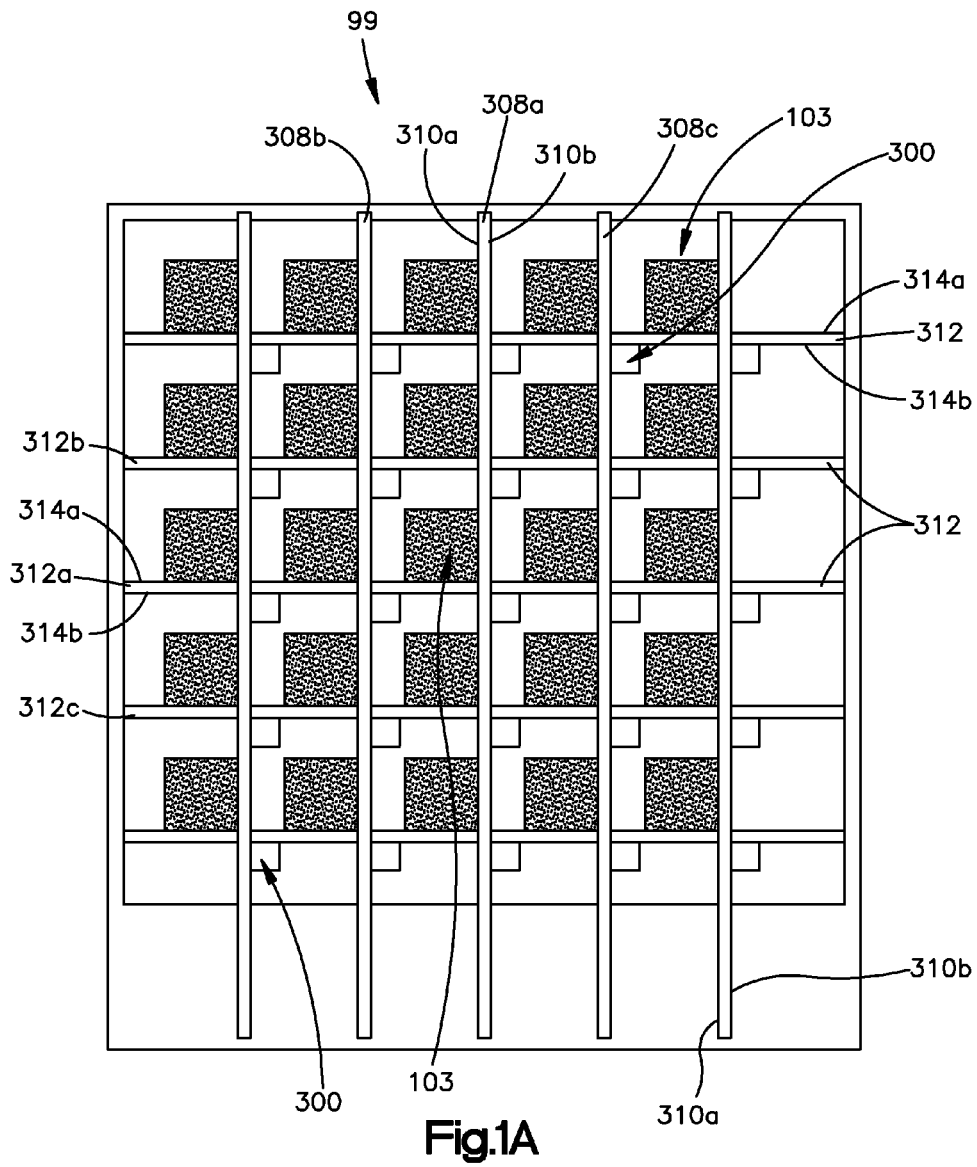
FIG. 1A is a plan view of an electrical connector system constructed in accordance with one embodiment including a plurality of electrical signal connectors and electrical power connectors mounted to a plurality of printed circuit boards that are arranged in an orthogonal arrangement.

For convenience, the same or equivalent elements in the various embodiments illustrated in the drawings have been identified with the same reference numerals. Certain terminology is used in the following description for convenience only and is not limiting. The words "left," "right," "front," "rear," "upper," and "lower" designate directions in the drawings to which reference is made. The words "forward," "forwardly," "rearward," "inner," "inward," "inwardly," "outer," "outward," "outwardly," "upward," "upwardly," "downward," and "downwardly" refer to directions toward and away from, respectively, the geometric center of the object referred to and designated parts thereof. The terminology intended to be non-limiting includes the above-listed words, derivatives thereof and words of similar import.

Referring initially to FIG. 1A, in accordance with one embodiment, an electrical connector system 99 can include a plurality of first electrical connector assemblies that are configured to be mated with respective complementary or second electrical connector assemblies. An electrical connector assembly, for instance a first electrical connector assembly, can include an electrical signal connector 100 (see FIG. 2) and an electrical power connector 306 (see FIG. 3B). The electrical signal connector 100 may be constructed in accordance with the electrical signal connectors described in U.S. Patent Publication No. 2013/0273781, which is incorporated by reference as if its contents are set forth herein. Examples of electrical power connectors are described below. It will be understood that the electrical power connector 306 may be constructed in accordance with the electrical power connector described in U.S. Pat. No. 8,043,097, which is incorporated by reference as if its contents are set forth herein, and PCT Patent Application No. PCT/US2014/025437, which is incorporated by reference as if its contents are set forth herein.

Figure 1B:
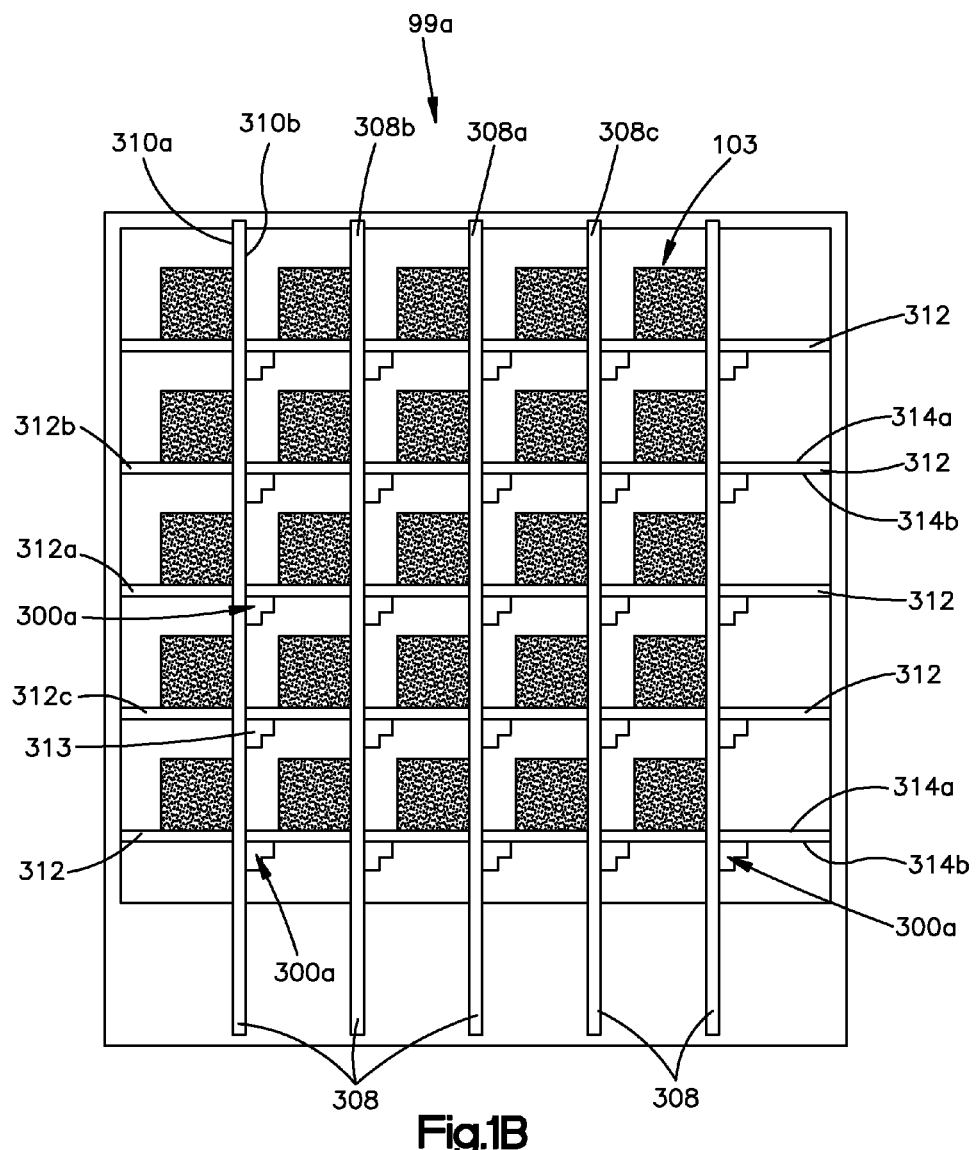
FIG. 1B is a plan view of the electrical connector system shown in FIG. 1A, wherein the electrical connector system includes L-shaped hermaphroditic power connectors in accordance with another embodiment.

Referring to FIGS. 1A-B, in accordance with the illustrated embodiments, the electrical connector assembly 99 can include a first plurality of printed circuit boards 312 spaced from each other along a first or transverse direction T. Each of the printed circuit boards 312 in the first plurality can define a first surface 314a and a second surface 314b that is opposite the first surface 314a along the first direction, such that the first surface 314a of a first printed circuit board, for instance a first printed circuit board 312a, of the first plurality faces the second surface 314b of a second printed circuit board, for instance a second printed circuit board 312b of the first plurality. The electrical connector assembly 99 can further include a second plurality of printed circuit boards 308 spaced from each other along a second or longitudinal direction L that is substantially perpendicular to the first direction. The printed circuit boards 312 in the first plurality can be spaced from the printed circuit boards 308 in the second plurality along a third or lateral direction A that is substantially perpendicular to both the first and second directions. The printed circuit boards 312 in the first plurality can be oriented substantially perpendicular to an orientation of the printed circuit boards 308 in the second plurality.

As shown, each of the printed circuit boards 308 of the second plurality can define a third surface 310a and a fourth surface 310b that is opposite the third surface 310a along the second direction, such that the third surface 310a of a third printed circuit board, for instance a third printed circuit board 308a of the second plurality, faces the fourth surface 310b of a fourth printed circuit board, for instance a fourth printed circuit board 308b, of the second plurality. A first electrical signal connector, for instance an electrical signal connector 100 (see FIG. 2), can be mounted to the first surface 314a of the first printed circuit board 312a. A second electrical signal connector, for instance a second electrical signal connector 200, can be mounted to the third surface 310a of the third printed circuit board 308a, and mated to the first electrical signal connector 100. As shown, the electrical connector system 99 can define a first empty space along the first direction from the second surface 314b of the second printed circuit board 312b to the first electrical signal connector 100.

Figure 8C:
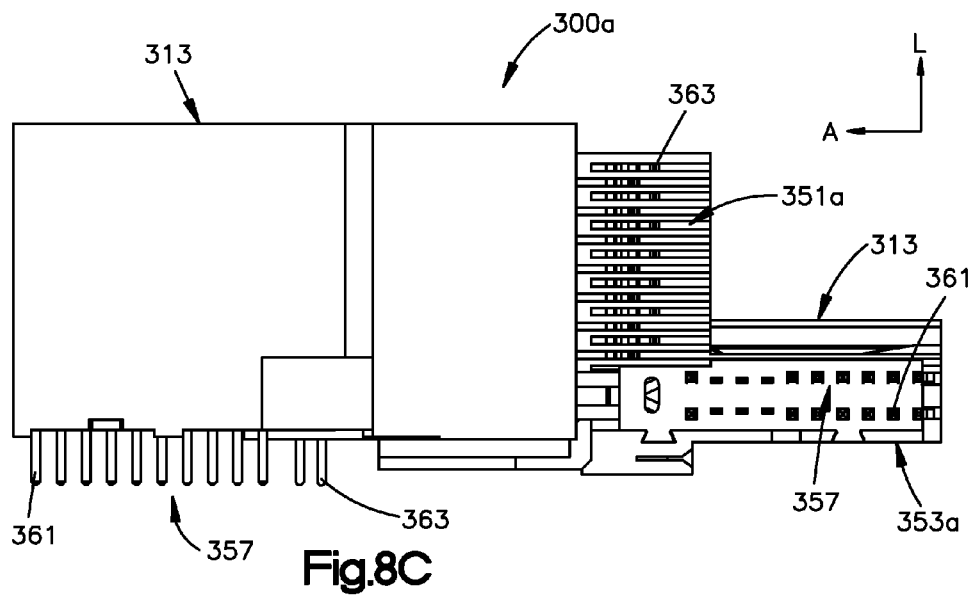
FIG. 8C is a plan view of the hermaphroditic power connector assembly shown in FIG. 8A, wherein the assembly is shown without the printed circuit boards so as to show the first and second hermaphroditic power connectors mated with each other.
Figure 8D:
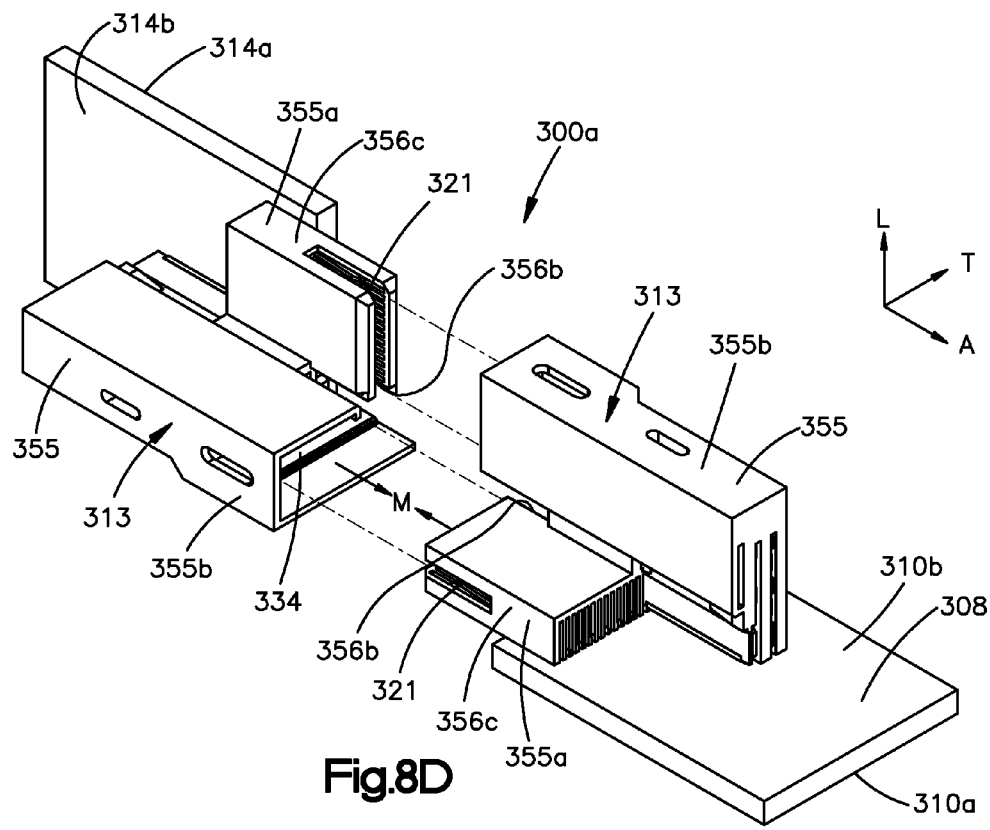
FIG. 8D is perspective view of the electrical connector system shown in FIGS. 8A-B, shown with the first and second hermaphroditic power connectors aligned to be mated with each other.

Still referring to FIGS. 1A and 1B, in accordance with the illustrated embodiments, the electrical connector system 99 can further define a second empty space along the second direction from the fourth surface 310b of the fourth printed circuit board 308b to the second electrical signal connector 200. The electrical connector system 99 can further include a first electrical power connector, for instance a first electrical power connector 311 (e.g., see FIGS. 3A-B) or a first hermaphroditic power connector 313 (e.g., see FIGS. 8A-B), mounted to the second surface 314b of the first printed circuit board 312a, and an electrical connector, for instance a second electrical power connector 306 or a second hermaphroditic power connector 313, mounted to the third surface 310a or the fourth surface 310b of the third printed circuit board 308a, and mated to the first electrical power connector 311. As shown in FIG. 1A, the first printed circuit board 312a can be disposed between the first electrical signal connector 100 and the first electrical power connector 311, and the third printed circuit board 308a is disposed between the second electrical signal connector 200 (see FIG. 2) and the second electrical power connector 306. As shown in FIG. 1B, the first printed circuit board 312a can be disposed between the first electrical signal connector 100 and the first hermaphroditic power connector 313, and the third printed circuit board 308a can be disposed between the second electrical signal connector 200 and the second hermaphroditic power connector 313.

The first plurality of printed circuit boards 312 and the second plurality of printed circuit boards 308 can intersect so as to define four quadrants. In one embodiment, the first and second electrical signal connectors 100 and 200 are mated to each other in a first one of the quadrants, and the first and second electrical power connectors 311 (see FIG. 3A) and 306 (see FIG. 3A) are mated to each other in a second one of the quadrants spaced from the first one of the quadrants along an oblique direction that includes the first and second directions. In another example embodiment, the first and second electrical signal connectors 100 and 200 are mated to each other in a first one of the quadrants, and the first and second hermaphroditic power connectors 313 (see FIG. 7A) are mated to each other in a second one of the quadrants spaced from the first one of the quadrants along an oblique direction that includes the first and second directions. Further, the second surface 314b of the first printed circuit board 312a can face the first surface 314a of a fifth printed circuit board, for instance a fifth printed circuit board 312c, of the first plurality such that the electrical connector system 99 can further define a third empty space along the first direction from the first surface 314a of fifth printed circuit board 312c to the second electrical power connector 306 or the second hermaphroditic power connector 313. The fourth surface 310b of the third printed circuit board 308a can face the third surface 310a of a sixth printed circuit board, for instance a sixth printed circuit board 308c of the second plurality such that the electrical connector system 99 further defines a fourth empty space along the second direction from the third surface 310a of the sixth printed circuit board 308c to the first electrical power connector 311 or the first hermaphroditic power connector 313. Thus, the connectors in the electrical system can be cooled by air, for instance forced air, that can flow through the empty spaces of the electrical connector system 99. Further, air can be applied directly to the signal connectors and power connectors because the signal connector does not abut a power connector in the electrical connector system 99. It is recognized herein that the electrical connector system 99 can lessen the effects of heat on printed circuit boards and connections over time. Further, it will be appreciated that the electrical connector system 99 can include any number of printed circuit boards and connectors as desired.

The first electrical signal connector 100 can be mounted to the first surface 314a of the first printed circuit board 312a, and the first electrical power connector 311 can be mounted to the second surface 314b of the first printed circuit board, though it will be understood that at least one, for instance both, of the connectors 100 and 311 can be signal connectors as desired. It will further be understood that at least one, for instance both, of the connectors 100 and 311 can be power connectors. For purposes of example, electrical connectors 100 and 200 are referred to throughout this disclosure as electrical signal connectors, but it will be understood that the electrical connectors 100 and 200 are not so limited. Similarly, for purposes of example the electrical connectors 311 and 306 are referred to throughout this disclosure as electrical power connectors, but it will be understood that the electrical connectors 311 and 306 are not so limited. As shown, the electrical connector system 99 can define a first empty space along the first direction from the second surface 314b of the second printed circuit board 312b to the first electrical signal connector 100.

Figure 2:
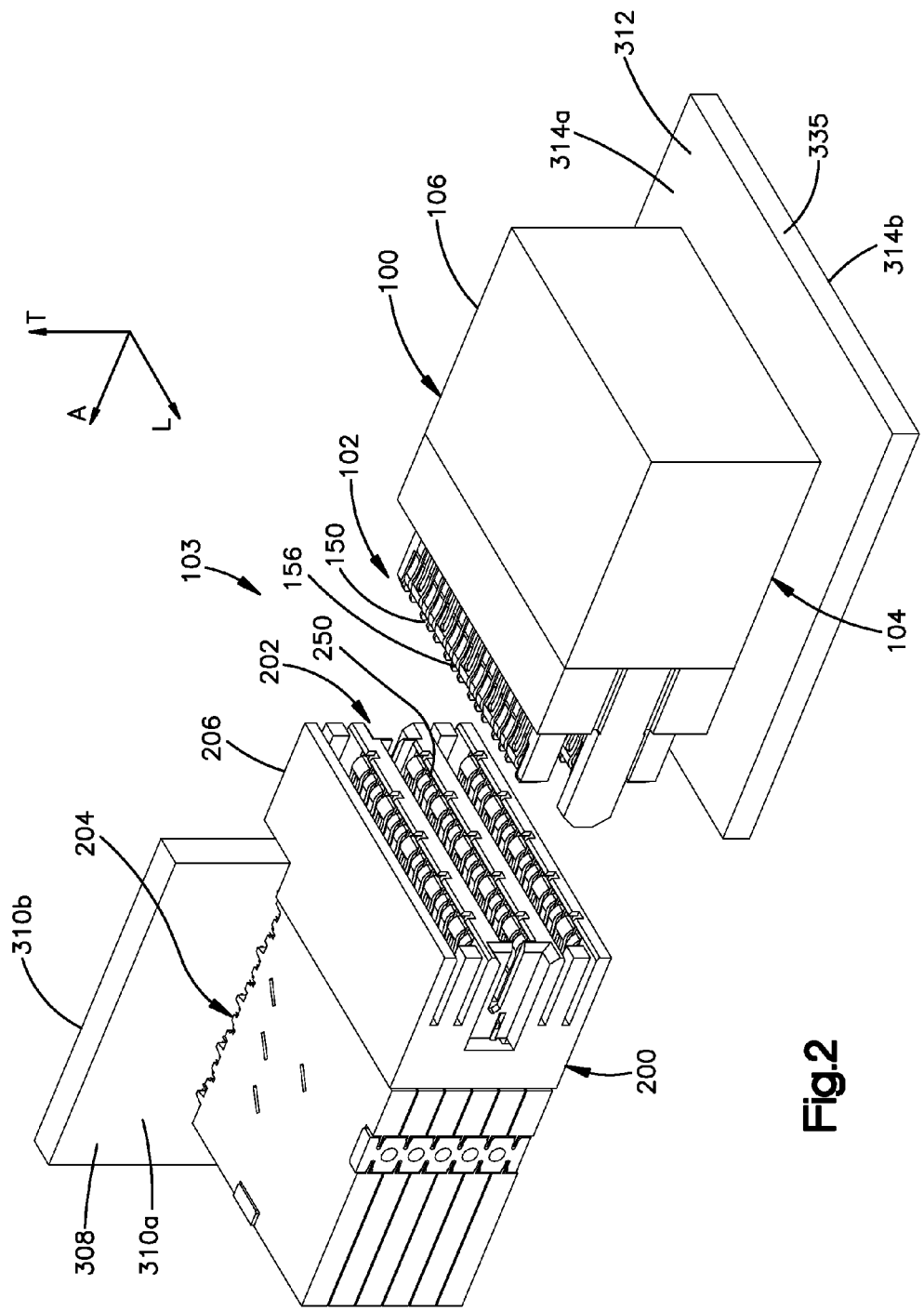
FIG. 2 is a perspective view of an electrical signal connector assembly that can be implemented in the electrical connector system shown in FIGS. 1A and 1B.

Referring also to FIG. 2, for example, an electrical signal connector assembly 103 can be configured as an orthogonal electrical connector assembly, and can include the first electrical signal connector 100 and a second electrical signal connector 200 that is configured as an orthogonal connector. The first and second electrical connectors 100 and 200 can be constructed in accordance with any embodiment described herein, unless otherwise indicated. For instance, the first electrical connector 100 can be configured as an orthogonal connector as described below. The second electrical connector 200 can be configured as a right angle connector, though it should be appreciated that the second electrical connector 200 can be constructed in accordance with any alternative embodiment as described herein.

The first electrical signal connector 100 can include a first dielectric, or electrically insulative connector housing 106 and a plurality of signal contacts 150 supported by the connector housing 106. The connector housing 106 can define a first mounting interface 104 and a first mating interface 102 configured to mate with a complementary mating interface of a complementary electrical signal connector. In accordance with the illustrated embodiment, the first electrical signal connector 100 can be constructed as an orthogonal electrical signal connector that defines the mating interface 102 and the mounting interface 104 that is oriented substantially perpendicular to the mating interface 102. Alternatively, the electrical signal connector 100 can be configured as a vertical electrical connector whereby the mating interface 102 is oriented substantially parallel with respect to the mounting interface 104. The second electrical signal connector 200 can be constructed as a right-angle electrical connector that defines a mating interface 202 and a mounting interface 204 that is oriented substantially perpendicular to the mating interface 202. Alternatively, the second electrical signal connector 200 can be configured as a vertical electrical signal connector whereby the mating interface 202 is oriented substantially perpendicular with respect to the mounting interface 204. The electrical signal connector 100 is configured to mate with the mating interface 202 of the second electrical signal connector 200 at its mating interface 202. Similarly, the electrical signal connector 200 is configured to mate with the mating interface 102 of the electrical signal connector 100 at its mating interface 202. The second electrical signal connector 200 can include a second electrically insulative connector housing 206 and a plurality of signal contacts 250 supported by the connector housing 206.

The first electrical signal connector 100 can include the electrically insulative connector housing 106 and the plurality of electrical contacts 150 that are supported by the connector housing 106. The plurality of electrical contacts 150 can be referred to as a first plurality of electrical contacts with respect to the electrical signal connector assembly 103. The plurality of electrical signal contacts 150 can include a first plurality of signal contacts 150 and a first plurality of ground contacts. The electrical signal contacts 152 can define respective mating ends 156 that extend along the mating interface 102, and mounting ends that extend along the mounting interface 104.

Figure 3B:
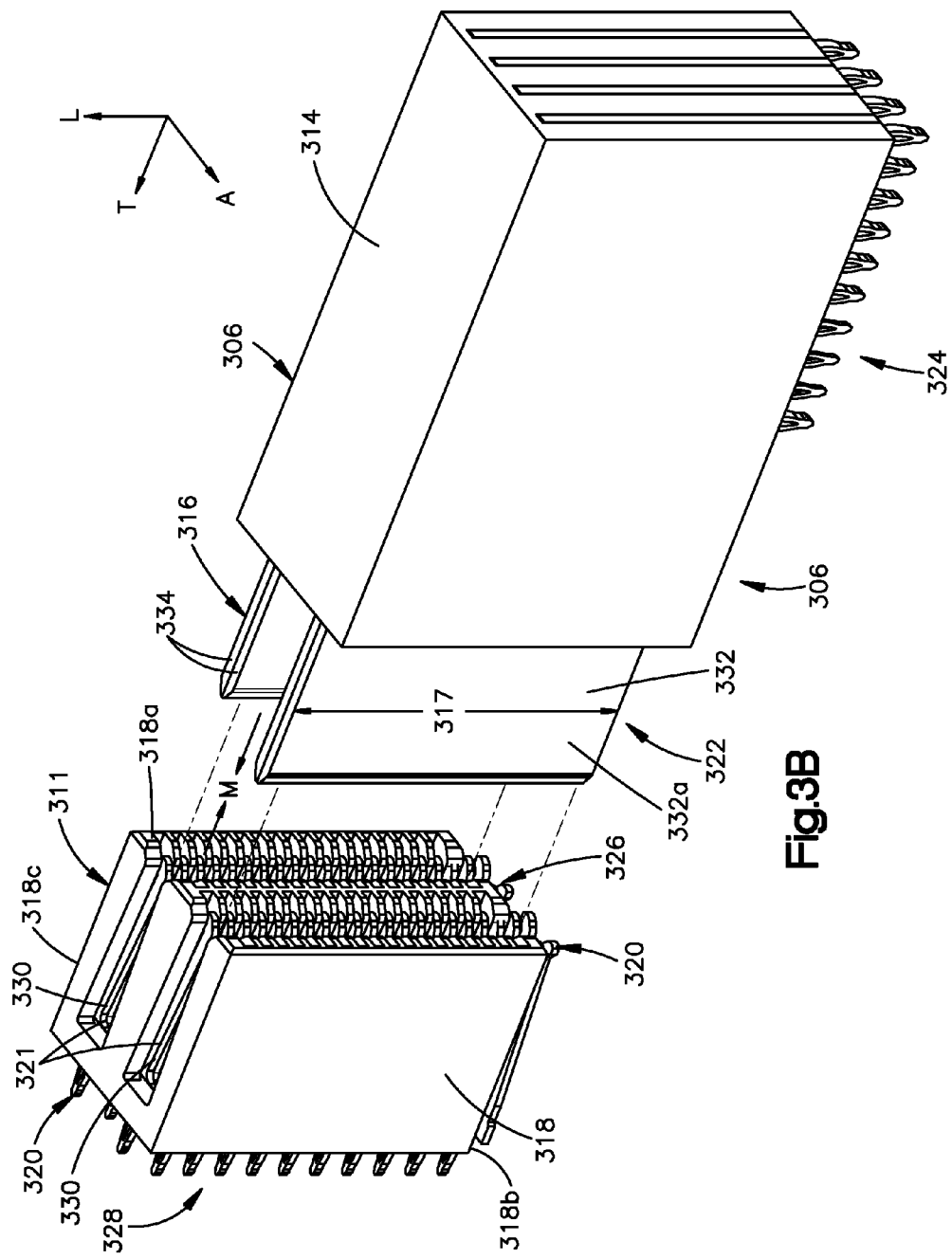
FIG. 3B is a perspective view of the electrical power connector assembly shown in FIG. 3A, the electrical power connector assembly including first and second power connectors that are aligned for mating with each other.

Referring to FIGS. 3A-B, an electrical power connector assembly 300 can be configured as an orthogonal electrical connector assembly, and can include the first electrical power connector 311 and the second electrical power connector 306 that can be configured as an orthogonal connector. The power connectors 306 and 311 can be constructed in accordance with any embodiment described herein, unless otherwise indicated. For instance, the electrical power connector 306 can be configured as an orthogonal or right angle connector as described below. The power connector 311 can also be configured as a right angle connector in the system 99, though it should be appreciated that the electrical power connector 311 can be constructed in accordance with any alternative embodiment as described herein.

Still referring to FIGS. 3A-B, the electrical power connector assembly 300 can include the second power connector 306 that is mounted to a first electrical component such as a second substrate or printed circuit board 308, and the first power connector 311 that is mounted to a second electrical component such as a substrate or first printed circuit board 312. The power connectors 306 and 311 can be configured to be mated with each other so as to establish an electrical connection, for instance an electrical connection that transfers electrical power, between the connectors 306 and 311. The power connector 306 can be configured to be mounted to the substrate 308 and the complementary power connector 311 can be configured to be mounted to the substrate 312 so as to establish an electrical connection between substrates 308 and 312. The substrates 308 and 312 can be provided as a backplane, daughtercard, or the like.

The power connector 306 can include a first dielectric or electrically insulative connector housing 314 and at least one such as a plurality of first electrical power contacts 316 that are at least partially disposed within the connector housing 314. The electrical contacts 316 can be configured as electrical power contacts that are configured to transmit electrical current between the substrate 308 and the power connector 311. When the power connector 306 is mounted to the substrate 308 along a mounting direction, the electrical contacts 316 are placed in electrical communication with electrical traces of the substrate 308. The power connector 311 can include a second dielectric or electrically insulative connector housing 318 and at least one electrical contact, for instance electrical contacts 320 that are supported by the connector housing 318. When the power connector 311 is mounted to the substrate 312, the electrical contacts 320 are placed in electrical communication with electrical traces of the substrate 312. The power connector 306 can be configured to mate with the complementary power connector 311 so as to establish an electrical connection between the first and second electrical contacts 316 and 320, respectively, and thus also between the electrical traces of the substrates 308 and 312.

In accordance with the illustrated embodiment, the power connector 306 can be constructed as a right-angle header connector that includes the connector housing 314. The connector housing 314 defines a mounting interface 324 and a mating interface 322 that is oriented perpendicular with respect to the mounting interface 324. It will be understood that the power connector 306 can be constructed as desired, for instance as a vertical connector such that the mating interface 322 is parallel to the mounting interface 324. The mating interface 322 can be configured to be mated with the power connector 311 and the mounting interface 324 can be configured to be mounted onto an electrical component. In accordance with the illustrated embodiment, the power connector 311 can be constructed as a vertical receptacle connector that defines a mating interface 326 and a mounting interface 328 that extends substantially parallel to the mating interface 326. The mating interface 322 of the power connector 306 can be configured to mate with the mating interface 326 of the power connector 311 that is to be mated with the power connector 306. The mounting interfaces 324 and 328, respectively, can be configured to mount onto underlying substrates, such as the respective printed circuit boards 308 and 312. The mating interface 326 of the power connector 311 can include receptacle slots 330 that are defined by the second connector housing 318, such that the electrical contacts 316 of the power connector 306 can be received in receptacle slots 330 when the power connector 106 is mated with the complementary power connector 311. The slots 330 can extend between opposed ends of the connector housing 318 to define respective open ends 321. As the connector housing 318 defines two slots 330, each with two open ends 321. Thus, the connector housing 318 defines four open ends 321, though it will be understood that the connector housing 318 can be constructed to define any number of slots and open ends as desired. As shown in the illustrated embodiment, the power connector 306 can be configured as a header connector and the power connector 311 can be configured as a receptacle connector, such that the connector housing 318 is configured to receive the electrical contacts 316 so as to mate power connectors 306 and 311.

Thus, unless otherwise specified herein, the terms "lateral," "longitudinal," and "transverse" are used to describe the orthogonal directional components of various components. The terms "inboard" and "inner," and "outboard" and "outer" and like terms when used with respect to a specified directional component are intended to refer to directions along the directional component toward and away from the center of the apparatus being described. It should be appreciated that while the longitudinal and lateral directions are illustrated as extending along a horizontal plane and that while the transverse direction is illustrated as extending along a vertical plane, the planes that encompass the various directions may differ during use, depending, for instance, on the orientation of the various components. Accordingly, the directional terms "vertical" and "horizontal" are used to describe the electrical connector system 99 and its components as illustrated merely for the purposes of clarity and convenience, it being appreciated that these orientations may change during use.

Referring to FIGS. 3A-B, the electrical contacts 316 of the power connector 306 can include respective mating portions 332 that are disposed proximate to the mating interface 322 and are configured to be electrically mated to a complementary electrical component, such as the electrical contacts 320 of the power connector 311. The mating portion 332 can include a mating end 332a. In accordance with the illustrated embodiment, the mating end 332a of the mating portion 332 extends forward from a front end 314a of the connector housing 314 along the transverse direction T. The electrical contacts 316 can be supported by the connector housing 314 such that the mating portion 332 extends out from the mating interface 322. The electrical power contact 316 can further including 1) a mounting portion that extends from the mounting interface 324 and is configured to electrically connect to a printed circuit board, 2) a mating portion 332 that extends out from the mating interface 322 and is configured to mate with a complementary electrical power contact of a complementary electrical power connector, such as the power connector 311, along a mating direction, and 3) an intermediate portion that extends between the mating portion 332 and the mounting portion, the intermediate portion configured to transmit electrical current between the mating portion 332 and the mounting portion. Still referring to FIGS. 3A-B, in accordance with the illustrated example, the mating portion 332 can include first and second contact blades 334 disposed adjacent each other and abutting each other along the third or lateral direction A that is substantially perpendicular to the mating direction. In response to a force applied to one of the first and second contact blades 334 along the third direction, a select portion of the power contact 316 that includes the first and second contact blades 334 can angulate with respect to at least a portion of the mounting portion such that at least one of the first and second contact blades 334 slides along the other of the first and second contact blades 334.

Referring now to FIGS. 1B and 5-8D, an electrical power connector assembly 300a can include the first hermaphroditic power connector 313 that includes a first receptacle portion 351a and a first header portion 353a. The electrical power connector assembly 300a can further include the second hermaphroditic power connector 313 that includes a second receptacle portion 351b configured to mate with the first header portion 353a, and a second header portion 353b configured to mate with the first receptacle portion 351a. As shown, the first header portion 353a can be identical to the second header portion 353b, and the first receptacle portion 351a can be identical to the second receptacle portion 351b, such that the first and second hermaphroditic power connectors are identical to each other and can be mated with each other.

The hermaphroditic power connectors 313 can each include an electrically insulative connector housing 355 defining a mounting interface 357 and a mating interface 359 configured to mate with a complementary mating interface of a complementary hermaphroditic power connector. Referring in particular to FIGS. 7A-D, in accordance with the illustrated example, the connector housing 355 can include a receptacle housing 355a defined by the receptacle portion 351a of the hermaphroditic power connector 313. The connector housing 355 can further include a header housing 355b defined by the header portion 353a of the hermaphroditic power connector 313. The receptacle housing 355a and the header housing 355b can be monolithic with each other. Alternatively, the receptacle housing 355a and the header housing 355b can be attached to each other as desired. The header portion 353a can be configured at least similarly, for instance identically, to the electrical power connector 306, described above, and the receptacle portion 351a can be configured at least similarly, for instance identically, to the electrical power connector 311 described above.

Thus, referring to FIGS. 8A-D, the electrical power connector assembly 300a can be configured as an orthogonal electrical connector assembly, and can include a pair of hermaphroditic power connectors 313 that are configured as orthogonal connectors. The electrical power connector assembly 300a can include the first hermaphroditic power connector 313 that can be mounted to a first electrical component, such as a substrate or the printed circuit board 312, and the second hermaphroditic power connector 313 that is mounted to a second electrical component, such as a substrate or the printed circuit board 308. The first and second hermaphroditic power connectors 313 can be configured to be mated with each other so as to establish an electrical connection, for instance an electrical connection that transfers electrical power, between the first and second hermaphroditic power connectors 313. The first and second hermaphroditic power connectors 313 can be configured to be mounted to the printed circuit boards 312 and 308 so as to establish an electrical connection between the printed circuit boards 312 and 308.

Figure 7C:
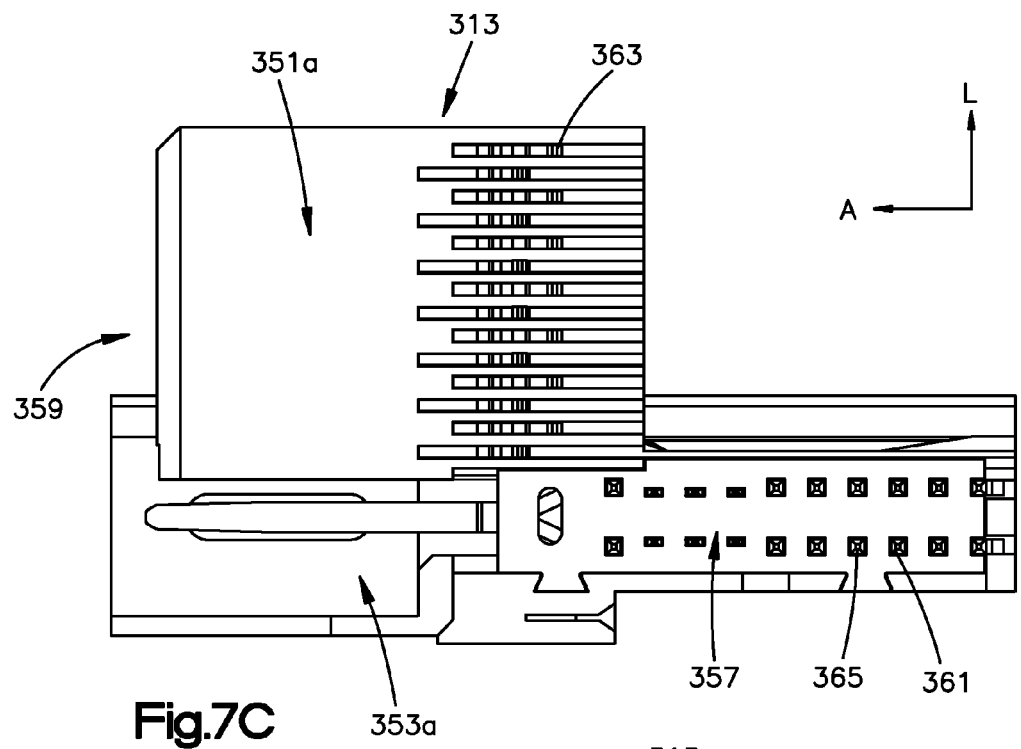
FIG. 7C is a bottom plan view of the hermaphroditic power connector shown in FIGS. 7A and 7B.
Figure 7D:
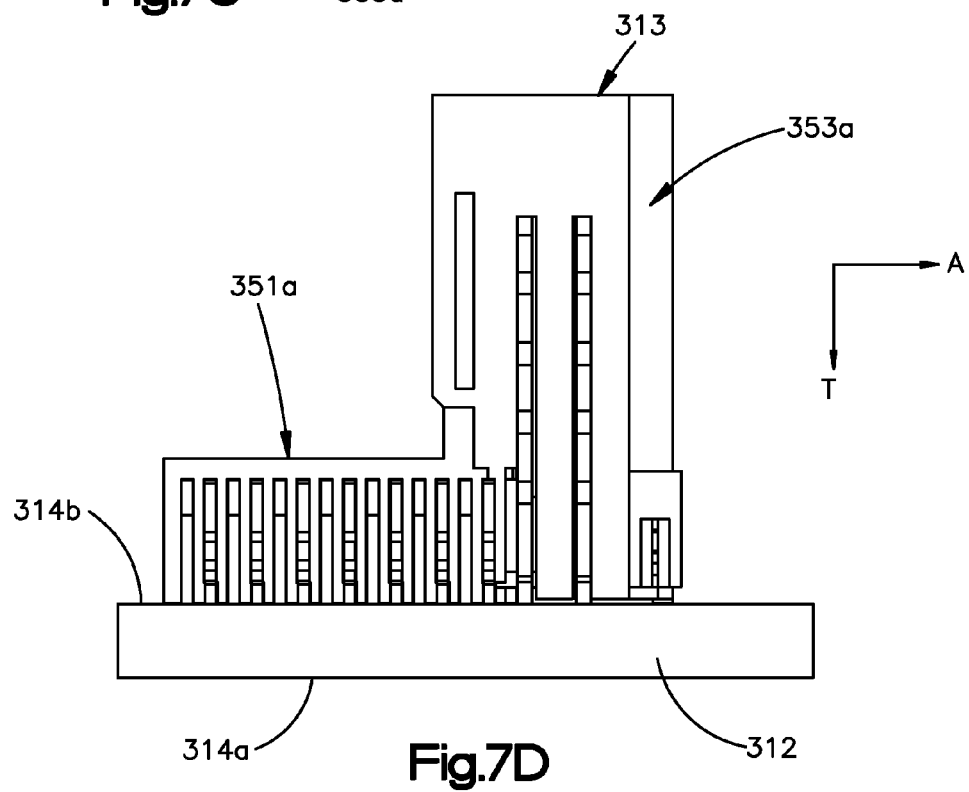
FIG. 7D is a rear elevation view of the hermaphroditic power connector shown in FIGS. 7A and 7B, shown mounted to the printed circuit board.

Referring again to FIGS. 7A-D, the hermaphroditic power connector 313 can include the dielectric or electrically insulative connector housing 355 and at least one such as a plurality of first electrical power contacts 361 that are at least partially disposed within the connector housing 355, and in particular the header housing 355b. The electrical contacts 361 can be configured as electrical power contacts that are configured to transmit electrical current between the printed circuit board 312 and the complementary hermaphroditic power connector 313. In one example, the electrical contacts 361 of the hermaphroditic power connector 313 are the same as the electrical contacts 316 of the power connector 306. When the hermaphroditic power connector 313 is mounted to the printed circuit board 312 along a mounting direction, which can be the transverse direction T as shown in FIGS. 7A-B, the electrical contacts 361 are placed in electrical communication with electrical traces of the printed circuit board 312. The hermaphroditic power connector 313 can further include at least one second electrical contact, for instance a plurality of second electrical contacts 363 that are supported by the connector housing 355, and in particular the receptacle housing 355a. In one example, the electrical contacts 363 of the hermaphroditic power connector 313 are the same as the electrical contacts 320 of the power connector 311. When the hermaphroditic power connector 313 is mounted to the substrate 312, the electrical contacts 363 are placed in electrical communication with electrical traces of the substrate 312. The first hermaphroditic power connector 313 can be configured to mate with the complementary hermaphroditic power connector 313 so as to establish an electrical connection between the first electrical contacts 361 of the first hermaphroditic power connector 313 and the second electrical contacts 363 of the complementary hermaphroditic power connector 313, and between the second electrical contacts 363 of the first hermaphroditic power connector 313 and the first electrical contacts 361 of the complementary hermaphroditic power connector 313, and thus also between the electrical traces of the printed circuit boards 308 and 312.

In accordance with the illustrated embodiment, the connector housing 355 defines the mounting interface 357 and the mating interface 359 that is oriented perpendicular with respect to the mounting interface 357. It will be understood that the power connector 313 can be constructed as desired. The mating interface 359 of the first hermaphroditic power connector 313 can be configured to be mated with mating interface 359 of the complementary hermaphroditic power connector 313, and the mounting interface 357 can be configured to be mounted onto an electrical component. The mating interface 359 of the hermaphroditic power connector 313 can include at least one, for instance one, receptacle slot 330 that is defined by the receptacle housing 355a, such that the first electrical contacts 361 can be received in the receptacle slot 330 when the hermaphroditic power connector 313 is mated with the complementary hermaphroditic power connector 313. As shown in the illustrated embodiment, the first electrical contacts 361 can be configured as header contacts 361 and the second electrical contacts 363 can configured as receptacle contacts 363. Further, the header housing 355b can be configured to receive at least a portion of the receptacle housing 355a, such that the header contacts 361 disposed within the header housing 355b are received by the receptacle contacts 363 disposed within the receptacle housing 355a, so as to mate the first hermaphroditic power connector 313 with the complementary hermaphroditic power connector 313.

The electrical contacts 361 of the hermaphroditic power connector 313 can include respective mating portions 332 that are disposed proximate to the mating interface 359 and are configured to be electrically mated to a complementary electrical component, such as the electrical contacts 363, along a mating direction. The mating portion 332 can include the mating end 332a. In accordance with one embodiment, the mating end 332a of the mating portion 332 of the electrical contacts 361 extends forward from a front end 356a of the connector housing 355 along the lateral direction A. In accordance with the illustrated embodiment, the mating end 332a of electrical contacts 361 is disposed at least partially within the header housing 355b, and thus the connector housing 355. The electrical contacts 361 can be supported by the connector housing 355 such that the mating portion 332 extends out from the mating interface 359. Alternatively, the electrical contacts 361 can be supported by connector housing 355 such that the mating portion 332 extends in from the mating interface 359. The electrical power contacts 361 can further include a mounting portion 365 that extends from the mounting interface 357 and is configured to electrically connect to a printed circuit board, and an intermediate portion that extends between the mating portion 332 and the mounting portion 365. The intermediate portion can be configured to transmit electrical current between the mating portion 332 and the mounting portion 365. The mating portion 332 can include first and second contact blades 334 disposed adjacent each other and abutting each other along a direction that is substantially perpendicular to the mating direction. Referring in particular to FIGS. 7A-F, in response to a force applied to one of the first and second contact blades 334 along the longitudinal direction L, a select portion of the power contact 361 that includes the first and second contact blades 334 can angulate with respect to at least a portion of the mounting portion 365, such that at least one of the first and second contact blades 334 slides along the other of the first and second contact blades 334.

Thus, the header portion 351b can include at one header power contact 363 supported by the connector housing 355, and the receptacle portion 351a can include at least one receptacle power contact 361 supported by the connector housing 355. Further, the mating interface 359 can define the slot 330 that can be configured to receive a complementary header power contact of the complementary hermaphroditic connector. The slot 330 can extend between opposed ends of the connector housing 355 of the hermaphroditic connector 313 to define at least one, for instance two, open ends 321. The mating portion 332 of the at least one header power contact 361 can be configured to flex. The connector housing 355 of the hermaphroditic connector 313 can define an L-shape, for instance when viewed along the mating direction.

Referring to FIGS. 1A-3B, the electrical connector system 99 can include a first electrical signal connector, for instance the electrical signal connector 100 that can includes a first electrically insulative connector housing 106 and a plurality of signal contacts 150 supported by the first connector housing 106. The connector housing 106 can define a first mounting interface, such as the mounting interface 104, and a first mating interface, for instance the mating interface 102, configured to mate with a complementary mating interface, for instance the mating interface 202, of a complementary electrical signal connector, for instance the electrical signal connector 200. The electrical connector system 99 can further include an electrical power connector, for instance the electrical power connector 306, that includes a second electrically insulative connector housing, for instance the housing 314, and at least one electrical power contact, for instance the power contact 316, supported by the connector housing 314. The second connector housing 314 can define a second mounting interface, for instance the mounting interface 324, and a second mating interface, for instance the mating interface 322 configured to mate with a complementary mating interface of a complementary power connector. The electrical connector system can further include a first printed circuit board, such as one of the printed circuit boards 312, defining the first surface 314a and the second surface 314b opposite the first surface along the first direction. The first mounting interface 104 can be mounted to the first surface 314a of the printed circuit board 312 and the second mounting interface 324 can be mounted to the second surface 314b of the printed circuit board 312.

In one embodiment, the electrical connector system 99 can include the electrical power connector 311 mounted to the second surface 314b of the printed circuit board 312. The power connector 311 can include the mating interface 326 that defines the slot 330 so as to define a receptacle power connector. Further, a second connector housing, for instance the connector housing 318 of the electrical power connector 311, can include 1) a front end 318a defined at the mating interface 326, a 2) a bottom end 318b and 3) a top end 318c opposite the bottom end 318b along a second or longitudinal direction L that is substantially perpendicular to the first or transverse direction T. The slot 330 can extend between the bottom end 318b and the top end 318c along the second direction. Thus, referring in particular to FIGS. 3A and 3B, the bottom end 318b and the top end 318c can each define an open end such that a mating end of the complementary electrical power contact can be offset from the at least one of the bottom end and the top end in the second direction when the power connector is mated with the complementary power connector.

In another embodiment, referring to FIGS. 1B, 5, and 7A-8D, the electrical connector system 99a can include the first hermaphroditic power connector 313 mounted to the second surface 314b of the printed circuit board 312. The first hermaphroditic power connector 313 can include the mating interface 359 that defines the slot 330 so as to define the first receptacle portion 351a. Further, the connector housing 355 can include 1) the front end 356a defined at the mating interface 359, a 2) a bottom end 356b and 3) a top end 356c opposite the bottom end 356b along a second or longitudinal direction L that is substantially perpendicular to the first or transverse direction T. The slot 330 can extend between the bottom end 356b and the top end 318c along the second direction. Thus, referring in particular to FIGS. 7E-F, the bottom end 356b and the top end 356c can each define a respective open end 321 such that a mating end of the electrical contact 361 can be offset from the at least one of the bottom end and the top end in the second direction when the first hermaphroditic power connector 313 is mated with the complementary hermaphroditic power connector 313.

Referring in particular to FIGS. 7A and 7B, in accordance with the illustrated embodiment, the connector housing 355 can define at least one opening such that the connector housing 355, for instance the header housing 355b, does not fully envelop at least one of, for instance all, the header contacts 361. The mating interface 359 of the connector housing 355 can define the at least one opening. For example, at least a portion, for instance at least a portion of the mating portion 332, of at least one header contact 361 can be visible when viewed along at least two directions that are perpendicular to each other. As shown, at least a portion of the header contacts 361 are visible when viewed along the mating direction M and the transverse direction T that is substantially perpendicular to both the mating direction M and the longitudinal direction L, which is defined by the open ends 321 of the slot 330.

Figure 5:
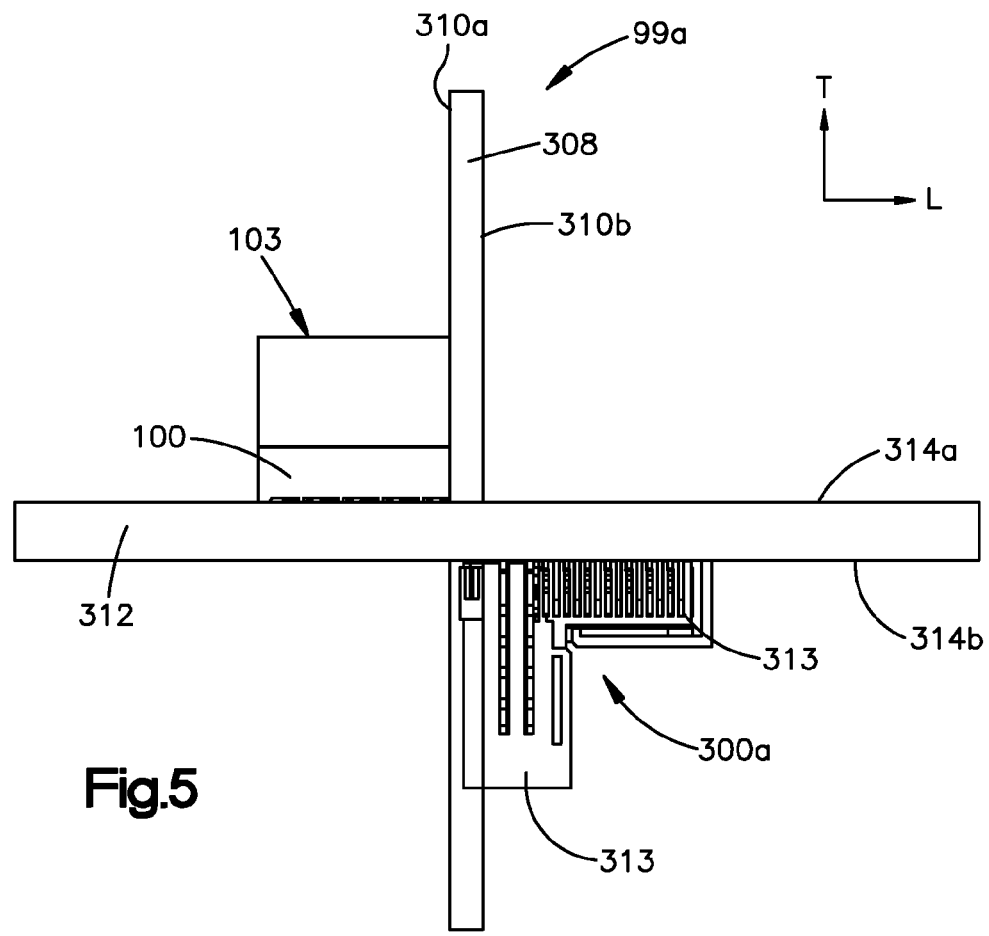
FIG. 5 is a perspective view of a portion of the electrical connector system shown in FIG. 1B, showing one electrical signal connector assembly and one electrical power connector assembly to define a single circuit.
Figure 6:
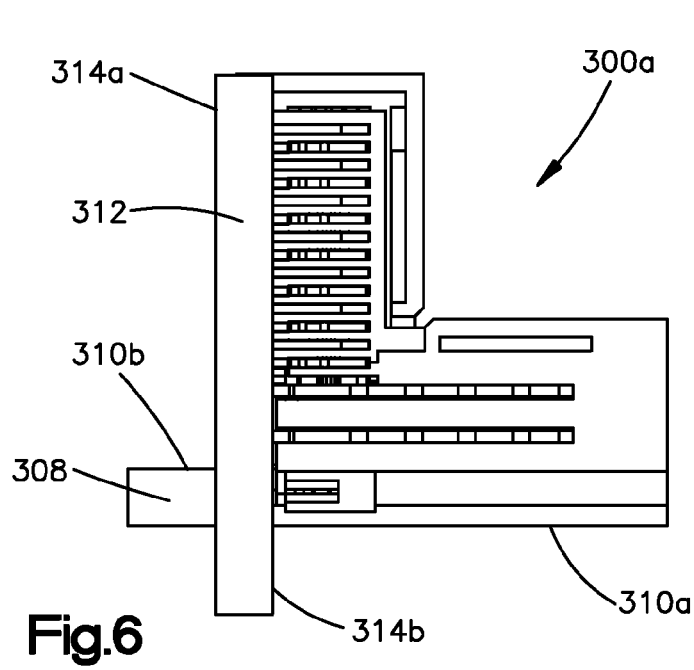
FIG. 6 is a plan view of a portion of the electrical connector system shown in FIG. 1B, in which the electrical power connector assembly includes two hermaphroditic power connectors.

Referring in particular to FIGS. 1A, 1B, and 5, the electrical connector system 99 can include a first printed circuit board 112 that can define the first surface 314a and the second surface 314b opposite the first surface 314a along a first direction or transverse direction T. The electrical connector system 99 can further include a second printed circuit board 308 defining the third surface 310a and the fourth surface 310b opposite the third surface 310a along a second or longitudinal direction L that is substantially perpendicular to the first direction such that the first printed circuit board 312 is oriented in a first plane that is substantially perpendicular to a second plane in which the second printed circuit board 308 is oriented. The electrical connector system can further include the electrical signal connector 100 that includes the mounting interface 104 mounted to the first surface 314a of the first printed circuit board 312. A first electrical power connector, for instance the electrical power connector 311, can include a second electrically insulative connector housing and at least one electrical power contact supported by the second connector housing, wherein the second connector housing defines a second mating interface and a second mounting interface mounted to the second surface 314b of the first printed circuit board 312. A second electrical signal connector, for instance the electrical signal connector 200, can be mounted to the third surface 310a of the second printed circuit board 308, and the second electrical signal connector can be mated with the first mating interface so to establish an electrical signal connection between the first printed circuit board 312 and the second printed circuit board 308. A second electrical power connector, for instance the electrical power connector 306, can be mounted to the fourth surface 310b of the second printed circuit board 312, and the second electrical power connector can be mated with the second mating interface so as to establish an electrical power connection between the first printed circuit board 312 and the second printed circuit board 308. In one embodiment, the first electrical power connector and the second electrical power connector can be hermaphroditic connectors.

Still referring to FIGS. 1A and 1B, the second electrical signal connector includes a third electrically insulative connector housing and a plurality of signal contacts supported by the third connector housing, and the second electrical power connector or the complementary hermaphroditic power connector can include a fourth electrically insulative connector housing and at least one power contact supported by the fourth connector housing. The first and second surfaces 314a and 314b of the first printed circuit board 312 can define a first thickness such that the first and third connector housings are spaced from the second and fourth connector housings a distance at least equal to the first thickness along the first direction. The third and fourth surfaces 310a and 310b of the second printed circuit board 308 can define a second thickness such that the first and third connector housings are spaced from the second and fourth connector housing a distance at least equal to the second thickness along the second direction. Thus, an intersection of the first and second printed circuit boards 312 and 308 can define four quadrants, and the first and third connector housings can be disposed in a first one of the four quadrants, and the second and fourth connector housings can be disposed in a second one of the four quadrants that is diagonally opposite the first one of the four quadrants. Referring in particular to FIG. 5, mounting tails of at least one of the first electrical signal connector and the second electrical power connector or the complementary hermaphroditic power connector can be disposed in a third one of the four quadrants, and mounting tails of at least one of the second electrical signal connector and the first electrical power connector or the first hermaphroditic power connector can be disposed in a fourth one of the four quadrants that is diagonally opposite the third one of the four quadrants.

In an alternative embodiment, as described above, an electrical connector, for instance the second power connector 306 (or the complementary hermaphroditic power connector) that includes the fourth connector housing, can be mounted to the third surface 310a of the second printed circuit board 308. Thus, an intersection of the first and second printed circuit boards can define four quadrants, and the first connector housing of the first electrical signal connector 100 and the third connector housing of the second electrical connector 200 can be disposed in a first one of the four quadrants, and the second connector housing of the first electrical power connector 311 (or the hermaphroditic power connector 313) and the fourth connector housing of the second power connector 306 (or the hermaphroditic power connector) can be disposed in a third one of the four quadrants that is directly opposite the first one of the four quadrants along the first direction such that the first one of the four quadrants and the third one of the four quadrants are aligned with each other along the second direction. In such a configuration, it will be understood that the connectors 100 and 311 (or 313) can be surface mounted to opposed sides of the first printed circuit board 312. The connectors 100 and 311 (or 313) can be aligned with other along the second direction such that the connectors 100 and 311 (or 313) are directly opposite each other along the first direction. In an alternative embodiment, at least one of the connectors 100 and 311 (or 313) that are aligned with each other along the second direction can be at least partially mounted in press-fit through holes defined by the printed circuit board 312. The electrical contacts of the electrical connector 100 can be received by different press-fit through holes than the press-fit through holes that receive the at least one contact of the connector 311 (or 313). In one embodiment, the press-fit holes can be defined such that the press-fit holes define a length that is less than, for instance about one half of, the thickness of the printed circuit board. It is recognized herein that the above-described configuration in which the power connectors 311 and 306 (or the first and second hermaphroditic power connectors 313) are disposed in the third one of the four quadrants that is directly opposite along the first direction of the first one of the four quadrants in which the signal connectors 100 and 200 are disposed, may be subject to noise, such as cross-talk for example. In accordance with various example embodiments, the noise can be at least mitigated by using at least one, for instance a combination of, various techniques. For instance, absorbing material can be attached to at least one end of at least one of the printed circuit boards 312 and 308. The electrical connectors can include lossy material. One or both of the connectors 100 and 311 (or 313) can be shielded from each other. Further, the signals paths can be routed away from the power plane on the printed circuit boards 308 and 312. It will be understood that other noise mitigation techniques can be included in the systems 99 and 99a as desired.

In one embodiment, the second power connector or the complementary hermaphroditic power connector 313 can define a third mating interface mated with the second mating interface of the first power connector or the first hermaphroditic power connector 313, wherein one of the second and third mating interfaces defines a slot, for instance the slot 330, so as to define a receptacle, and the other of the second and third mating interfaces defines at least one contact blade 334 so as to define a header. The at least one contact blade 334 can define a height 317 that can be greater than a length 333 of the slot such that a portion 335 of the at least one contact blade 334 is visible when viewed along a third direction that is substantially perpendicular to both the first and second directions.

Referring to FIGS. 1A, 3B, and 4A-C, the electrical connector system 99 can include the first printed circuit board 312 defining the first surface 314a and the second surface 314b opposite the first surface 314a along a first direction. A first electrical signal connector can be mounted to the first surface 314a of the first printed circuit board 312. A first electrical power connector, for instance the power connector 311, can be mounted to the second surface 314b of the first printed circuit board 312 at a location offset from the first signal connector along a second perpendicular to the first direction. The electrical connector system 99 can further include the second printed circuit board 308 orthogonal to the first printed circuit board 312, and the second printed circuit board 308 can define the third surface 310a and the fourth surface 310b opposite the third surface 310a. A second electrical signal connector can be mounted to the third surface 310a of the second printed circuit board 308. A second electrical power connector, for instance the power connector 306, can be mounted to the third surface 310a of the second printed circuit board. Alternatively, as illustrated, the connector 306 can be mounted to the fourth surface 310b of the second printed circuit board 308 at a location offset from the second electrical signal connector along a third direction perpendicular to the first direction.

It will be understood that a thickness of a printed circuit board can vary, for example, based on a tolerance of a manufacturer. Further, position of the connectors in the electrical connector system can vary. The flexible power connector 306 and the power connector 311 that can include open ends 321 can allow power connectors to mate when the thickness of substrates vary and/or their positions vary. For example, referring to FIGS. 4A-C, the power connector assembly 300 can include a header electrical power connector, for instance the power connector 306, including a header electrically insulative connector housing that defines a mating interface, and at least one first electrical power contact supported by the header connector housing, the at least one first electrical power contact including a mating portion that extends out from the mating interface. The mating portion of the header connector 306 can define the height 317 in a first direction. A receptacle electrical power connector, for instance the power connector 311, can include a receptacle electrically insulative connector housing that defines a slot, for instance the slot 330, elongate in the first direction, and at least one second electrical power contact disposed within the slot. The first electrical power contact can be at least partially received in the slot 330 along a mating direction M that is substantially perpendicular to the first direction so as to contact the at least one second electrical contact. As shown, the height 317 of the mating portion of the first electrical contact can be greater than the length 333 of the receptacle slot 330 in the first direction such that the portion 335 of the at least one first electrical power contact is visible when viewed along a direction that is substantially perpendicular to both the first and mating directions. The size of the portion 335 can vary based on a thickness of the printed circuit board 308 along the second direction. The flex of the first electrical power contact can vary based on a thickness of the printed circuit board 312 along the first direction.

It will be understood that the height 317 of the mating portion of the electrical power contacts 316 can vary as desired, and the length 333 of the receptacle slot 330 can vary as desired. For example, the length 333 of the receptacle slot 330 can be greater than the height 317, such that the mating portion of the electrical power connector 306, which can be referred to as a header connector 306, is fully contained within the receptacle slot 330 along the longitudinal direction L when the electrical power connector 306 is mated with the electrical power connector 311. Furthermore, the length 333 of the receptacle slot 330 and height 317 of the mating portion of the electrical contacts 316 can each be sized such that each of the electrical contacts 320, which can be also be referred to as receptacle contacts 320, contact at least one of the contact blades 334 of the electrical contacts 316 when the power connector 306 is mated with the power connector 311, regardless of whether the power connector 306 and the power connector 316 are aligned with each other along the longitudinal direction L. Thus, referring in particular to FIG. 4C, the length 333 of the receptacle slot 330 can be alternatively sized such that the connector housing 318 abuts the printed circuit board 308 when the electrical power connectors 306 and 311 are mated with each other as shown.

The power connector assembly, in particular the height 317 of the mating portion of the at least one electrical power contact, can be configured to carry at least 10 amps. The at least one first electrical power contact can further include a mounting portion that extends out from a mounting interface of the header connector housing, the mating portion including first and second contact blades disposed adjacent each other and abutting each other along the second direction. In response to a force applied to one of the first and second contact blades along the second direction, a select portion of the power contact that includes the first and second contact blades can angulate with respect to at least a portion of the mounting portion, and between 75% and 80% of the angulation can occur at a predetermined region of the first electrical power contact. The first electrical power contact can deflected so as to contact the second electrical power contact.

A method of mating a first electrical signal connector to a second electrical connector, and a first electrical power connector to a second electrical power connector can include bringing the first and second electrical signal connectors toward each other until respective electrical signal contacts of the first electrical signal connector mate with respective electrical signal contacts of the second electrical signal connector, and bringing the first and second electrical power connectors toward each other until respective electrical power contacts of the first electrical power connector mate with respective electrical power contacts of the second electrical power connector. The method can further include generally aligning a mating portion of the plurality of signal contacts supported by the first connector housing with a mating portion of a second plurality of signal contacts of the second electrical signal connector, and bringing the mating portion of the plurality of signal contacts supported by the first connector housing into contact with the mating portion of the second plurality of signal contacts. In response to the bringing step, the at least one electrical power contact supported by the second connector housing can be caused to flex and to be brought into contact with at least one second power contact of the second electrical power connector, wherein the first electrical signal connector and the first electrical power connector are mounted to opposed sides of a printed circuit board.

In operation, a first electrical power connector, for instance the first hermaphroditic power connector, can be mounted to a first printed circuit board having first and second surfaces spaced from each other along a first direction, and a second electrical power connector, for instance the complementary hermaphroditic power connector, can be mounted to a second printed circuit board having third and fourth surfaces spaced from each other along a second direction perpendicular to the first direction. Further, an electrical power contact of the first electrical power connector can be inserted into a receptacle of a second electrical power connector, wherein the receptacle is elongate from a first open end to a second open end opposite the first open end and spaced from the first open end along the first direction. During insertion, a method can include causing one or both of 1) a first portion of the power contact to flex with respect to a second portion of the power contact along an axis that is oriented in the first direction, and 2) the power contact to slide into at least one of the first and second open ends of the receptacle along the first direction. Thus, the first and second surfaces can define a first thickness of the first printed circuit board along the first direction, and the first portion of the power contact can flex based on the first thickness. Further, the third and fourth surfaces can define a second thickness of the second printed circuit board along the second direction, and the power contact can slide into the at least one of the first and second open ends based on the second thickness. Thus, at least one of the first and second power contacts can flex based on a thickness of at least of the first and second printed circuit boards. In another embodiment, the first portion of the power contact can be flexed with respect to the second portion of the power contact based on a position of at least one of the first and second electrical power connectors on the first and second printed circuit boards, respectively. Further, the power contact can slide into at last one of the first and second open ends based on a position of at least one of the first and second electrical power connectors on the first and second printed circuit boards, respectively.

A method using the signal and power connectors described herein can include mounting a first electrical signal connector to a first surface of a first printed circuit board, and mounting a first power connector to a second surface of the first printed circuit board opposite the first surface at a location offset from the first signal connector along a second direction perpendicular to the first direction. A second electrical signal connector can be mounted to a third surface of a second printed circuit board orthogonal to the first printed circuit board, and a second power connector can be mounted to a fourth surface of the second printed circuit board opposite the third surface at a location offset from the second signal connector along a third direction perpendicular to the first direction. Further, the first electrical signal connector can be mated with the second electrical signal connector so as to establish an electrical signal connection between the first and second printed circuit boards, and the first electrical power connector can be mated with the second electrical power connector so as to establish an electrical power connection between the first and second printed circuit boards.

A method of cooling an orthogonal connector system, for instance the connector system 99 and 99a, can include providing or teaching to a third party the use of a first electrical signal connector as described herein such that the first electrical signal connector can be mounted to a first surface of a printed circuit board, and providing or teaching the use of a first electrical power connector, for instance the first hermaphroditic power connector, as described herein such that the first electrical power connector can be mounted to a second surface of the printed circuit board that is opposite the first surface. The method of cooling can further include selling to the third party one or both of the first electrical signal connector and the first electrical power connector. In one embodiment, a method can include teaching the step of mating first electrical signal and power electrical connectors with one or more complementary electrical signal and power connectors, respectively. In another embodiment, a method can include teaching the step of mounting a complementary electrical signal connector and a complementary power connector to opposed surfaces of a complementary printed circuit board with respect to each other, the opposed surfaces spaced from each other along a second direction that is substantially perpendicular to the first direction such that the first printed circuit board is disposed between the complementary signal connector and the complementary power connector along the first direction when the first and complementary signal connectors are mated with the first and complementary power connectors, respectively.

An electrical connector assembly can be sold by displaying a visual depiction, at a host, of the electrical connector system 99 or 99a over a tangible medium of expression, and offering for sale over the tangible medium of expression first and second electrical signal connectors as described herein, and first and second electrical power connectors as described herein, for instance first and second hermaphroditic power connector as described herein. The tangible medium of expression can be the Internet. The first electrical signal connector and second electrical signal connector can offered for sale separately from each other or in combination with each other. The first electrical power connector and second electrical power connector can be offered for sale separately from each other or in combination with each other. The host can receive, over the tangible medium of expression, an order for at least one of the first electrical signal connector, the second electrical signal connector, the first electrical power connector, and the second electrical power connector.

A method of ordering an electrical connector assembly can include receiving a visual depiction, from a host, of the electrical connector system, for instance the electrical connector system 99 or the electrical connector system 99a, over a tangible medium of expression. The method can further include ordering for purchase over the tangible medium of expression first and second electrical signal connectors as described herein, and first and second electrical power connectors as described herein. The first electrical signal connector and the second electrical signal connector can be ordered for purchase separately from each other or in combination with each as a mated pair. The first electrical power connector and the second electrical power connector can be ordered for purchase separately from each other or in combination with each other as a mating pair. The method of ordering can further include viewing an electrical signal connector on a visual depiction fixed in a tangible medium of expression, the electrical signal connector having a mounting interface configured to mount to a first surface of a printed circuit board; viewing an electrical power connector on the visual depiction fixed in the tangible medium of expression, the electrical power connector having a mounting interface configured to mount to a second surface of the printed circuit board that is opposite the first surface; and purchasing at least one of the electrical signal connector and the electrical power connector via the tangible medium of expression. The tangible medium of expression can be the Internet.

The embodiments described in connection with the illustrated embodiments have been presented by way of illustration, and the present invention is therefore not intended to be limited to the disclosed embodiments. Furthermore, the structure and features of each of the embodiments described above can be applied to the other embodiments described herein, unless otherwise indicated. Accordingly, the invention is intended to encompass all modifications and alternative arrangement included within the scope of the invention, for instance as set forth by the appended claims.

What is claimed:

1. An electrical connector system comprising:
   a first printed circuit board defining a first surface and second surface opposite the first surface along a first direction;
   a first electrical signal connector mounted to the first surface of the first printed circuit board;
   a first electrical power connector mounted to the second surface of the first printed circuit board at a location offset from the first signal connector along a second direction perpendicular to the first direction;
   a second printed circuit board orthogonal to the first printed circuit board, the second printed circuit board defining a third surface and a fourth surface opposite the third surface;
   a second electrical signal connector mounted to the third surface of the second printed circuit board; and
   a second electrical power connector mounted to the fourth surface of the second printed circuit board at a location offset from the second electrical signal connector along a third direction perpendicular to the first direction; wherein:
   the first electrical signal connector is mated with the second electrical signal connector so as to establish an electrical signal connection between the first and second printed circuit boards; and
   the first electrical power connector is mated with the second electrical power connector so as to establish an electrical power connection between the first and second printed circuit boards.

2. An electrical connector system comprising:
   a first plurality of printed circuit boards spaced from each other along a first direction, each of the printed circuit boards in the first plurality defining a first surface and a second surface that is opposite the first surface along the first direction, such that the first surface of a first printed circuit board of the first plurality faces the second surface of a second printed circuit board of the first plurality;
   a second plurality of printed circuit boards spaced from each other along a second direction that is substantially perpendicular to the first direction, each of the printed circuit boards of the second plurality defining a third surface and a fourth surface that is opposite the third surface along the second direction, such that the third surface of a third printed circuit board of the second plurality faces the fourth surface of a fourth printed circuit board of the second plurality;
a first electrical signal connector mounted to the first surface of the first printed circuit board;
a second electrical signal connector mounted to the third surface of the third printed circuit board and mated to the first electrical signal connector;
a first electrical power connector mounted to the second surface of the first printed circuit board; and
a second electrical power connector mounted to the fourth surface of the third printed circuit board and mated to the first electrical power connector,
wherein the electrical connector system defines a first empty space along the first direction from the second surface of the second printed circuit board to the first electrical signal connector.

3. The electrical connector system of claim 2, wherein the electrical connector system further defines a second empty space along the second direction from the fourth surface of the fourth printed circuit board to the second electrical signal connector.

4. The electrical connector system of claim 2, wherein the first printed circuit board is disposed between the first electrical signal connector and the first electrical power connector, and the third printed circuit board is disposed between the second electrical signal connector and the second electrical power connector.

5. The electrical connector system of claim 2, wherein each of the first and second pluralities of printed circuit boards intersect so as to define four quadrants, the first and second electrical signal connectors are mated to each other in a first one of the quadrants, and the first and second electrical power connectors are mated to each other in a second one of the quadrants spaced from the first one of the quadrants along an oblique direction that includes the first and second directions.

6. The electrical connector system of claim 2, wherein the second surface of the first printed circuit board faces the first surface of a fifth printed circuit board of the first plurality such that the electrical connector system further defines a third empty space along the first direction from the first surface of fifth printed circuit board to the second electrical power connector.

7. The electrical connector system of claim 2, wherein the fourth surface of the third printed circuit board faces the third surface of a sixth printed circuit board of the second plurality such that the electrical connector system further defines a fourth empty space along the second direction from the third surface of the six printed circuit board to the first electrical power connector.

8. The electrical connector system of claim 2, wherein the first electrical power connector includes 1) at least one header power contact received by at least one receptacle power contact of the second electrical power connector, and 2) at least one receptacle power contact mated with at least one header power contact of the second electrical power contact.

9. The electrical connector system of claim 2, wherein the first and second electrical power connectors are each hermaphroditic power connectors.

10. A hermaphroditic power connector comprising:
an electrically insulative connector housing defining a mounting interface and a mating interface configured to mate with a complementary mating interface of a like hermaphroditic power connector, the mating interface comprising:
a first portion and a second portion;
at least one header power contact having a mating portion with a mating end extending in a first direction; and
a row, extending in a second direction orthogonal to the first direction, of receptacle contacts;
wherein;
the second portion of the electrically insulative connector housing comprises a slot, having an elongated dimension extending in the second direction, configured to receive a complementary at least one header power contact of the like hermaphroditic power connector;
the row of receptacle power contacts is disposed within the slot; and
the first portion of the electrically insulative connector housing comprises an opening sized to receive a complementary second portion of the like hermaphroditic power connector.

11. The power connector as recited in claim 10, wherein the at least one header contact includes a mounting portion configured to electrically connect to a substrate, and a mating portion configured to mate with a complementary receptacle power contact of the like hermaphroditic connector, and the mating portion of the at least one header power contact is configured to flex with respect to the mounting portion of the at least one header contact.

12. The power connector as recited in claim 10, wherein the slot extends between opposed ends of the connector housing that define two open ends.

13. A method comprising:
mounting a first electrical power connector to a first printed circuit board having first and second surfaces spaced from each other along a first direction;
mounting a second electrical power connector to a second printed circuit board having third and fourth surfaces spaced from each other along a second direction perpendicular to the first direction;
inserting an electrical power contact, extending in an insertion direction that is parallel to the second direction, of the first electrical power connector into a receptacle of a second electrical power connector, wherein:
the receptacle is elongate from a first open end to a second open end opposite the first open end and spaced from the first open end along a sliding direction that is parallel to the first direction; and
the electrical power contact is configured such that 1) a first portion of the electrical power contact is capable of flexing with respect to a second portion of the electrical power contact along an axis that is oriented in the sliding direction and 2) the electrical power contact is capable of sliding into at least one of the first and second open ends of the receptacle along the sliding direction; and
during the inserting step, causing one or both of 1) the first portion of the electrical power contact to flex with respect to the second portion of the electrical power contact along the axis that is oriented in the sliding direction, and 2) the electrical power contact to slide into at least one of the first and second open ends of the receptacle along the sliding direction.

14. The method as recited in claim 13, wherein the first and second surfaces define a first thickness of the first printed circuit board along the first direction, and the first portion of the power contact flexes based on the first thickness.

15. The method as recited in claim 13, wherein the third and fourth surfaces define a second thickness of the second printed circuit board along the second direction, and the power contact slides into the at least one of the first and second open ends based on the second thickness.

16. The method as recited in claim 13, wherein the first portion of the power contact is flexed with respect to the second portion of the power contact based on a position of at least one of the first and second electrical power connectors on the first and second printed circuit boards, respectively.

17. The method as recited in claim 13, wherein the power contact slides into at least one of the first and second open ends based on a position of at least one of the first and second electrical power connectors on the first and second printed circuit boards, respectively.

* * * * *